US011573398B2

(12) United States Patent
Xu et al.

(10) Patent No.: US 11,573,398 B2
(45) Date of Patent: Feb. 7, 2023

(54) OPTICAL IMAGING LENS GROUP

(71) Applicant: Zhejiang Sunny Optical Co., Ltd, Zhejiang Province (CN)

(72) Inventors: Biao Xu, Zhejiang Province (CN); Kaiyuan Zhang, Zhejiang Province (CN); Xiaofang Wang, Zhejiang Province (CN); Fujian Dai, Zhejiang Province (CN); Liefeng Zhao, Zhejiang Province (CN)

(73) Assignee: Zhejiang Sunny Optical Co., Ltd., Zhejiang Province (CN)

( * ) Notice: Subject to any disclaimer, the term of this patent is extended or adjusted under 35 U.S.C. 154(b) by 372 days.

(21) Appl. No.: 16/996,456

(22) Filed: Aug. 18, 2020

(65) Prior Publication Data
US 2021/0063689 A1 Mar. 4, 2021

(30) Foreign Application Priority Data

Sep. 3, 2019 (CN) .......................... 201910827432.2

(51) Int. Cl.
*G02B 9/62* (2006.01)
*G02B 3/04* (2006.01)
(Continued)

(52) U.S. Cl.
CPC ................ *G02B 9/62* (2013.01); *G02B 3/04* (2013.01); *G02B 13/18* (2013.01); *G02B 5/005* (2013.01);
(Continued)

(58) Field of Classification Search
CPC .......... G02B 5/005; G02B 13/18; G02B 9/62; G02B 3/04; G02B 13/002; G02B 13/0045;
(Continued)

(56) References Cited

U.S. PATENT DOCUMENTS 9,057,868 B1 6/2015 Chung et al.
10,007,093 B2 * 6/2018 Chen ........................ G02B 9/60
(Continued)

FOREIGN PATENT DOCUMENTS

CN 111399174 A * 7/2020 ............. G02B 13/02
CN 109814238 B * 5/2021 ......... G02B 13/0045
(Continued)

OTHER PUBLICATIONS

Office Action dated Nov. 22, 2021, in connection with Indian Application No. 202014036672.

*Primary Examiner* — Evelyn A Lester
(74) *Attorney, Agent, or Firm* — Norris McLaughlin, P.A.

(57) ABSTRACT

The present disclosure discloses an optical imaging lens group including, sequentially from an object side to an image side along an optical axis, a first lens having positive refractive power with a convex object-side surface; a second lens having refractive power; a third lens having refractive power; a fourth lens having refractive power; a fifth lens having refractive power; and a sixth lens having negative refractive power with a concave object-side surface and a convex image-side surface. A total effective focal length f of the optical imaging lens group, an entrance pupil diameter EPD of the optical imaging lens group and half of a maximal field-of-view Semi-FOV of the optical imaging lens group satisfy: f/EPD<2, and f*tan(Semi-FOV)>4.5 mm.

20 Claims, 11 Drawing Sheets

(51) Int. Cl.
  *G02B 13/18*    (2006.01)
  *H01L 27/146*   (2006.01)
  *H04N 5/372*    (2011.01)
  *G02B 13/00*    (2006.01)
  *G02B 5/00*     (2006.01)
  *G02B 13/02*    (2006.01)

(52) U.S. Cl.
  CPC ........ *G02B 13/002* (2013.01); *G02B 13/0045* (2013.01); *G02B 13/02* (2013.01); *H01L 27/14643* (2013.01); *H04N 5/372* (2013.01)

(58) Field of Classification Search
  CPC ... G02B 13/02; H01L 27/14643; H04N 5/372
  USPC ................ 359/713, 739, 740, 745, 756, 757
  See application file for complete search history.

(56) References Cited

U.S. PATENT DOCUMENTS

| | | | | |
|---|---|---|---|---|
| 10,031,320 B2* | 7/2018 | Wang | ................ | G02B 13/18 |
| 10,371,927 B2* | 8/2019 | Huang | ................ | G02B 9/62 |
| 10,782,505 B2* | 9/2020 | Huang | ................ | G02B 13/02 |
| 11,137,577 B2* | 10/2021 | Kuo | ................ | G02B 9/62 |
| 11,204,485 B2* | 12/2021 | Wang | ................ | G02B 7/08 |
| 11,262,542 B2* | 3/2022 | Huang | ................ | G02B 9/62 |
| 11,366,295 B2* | 6/2022 | Wang | ................ | G02B 9/62 |
| 11,435,556 B2* | 9/2022 | Bian | ................ | G02B 13/0045 |
| 2014/0139931 A1 | 5/2014 | Kubota | | |
| 2016/0187622 A1* | 6/2016 | Huang | ................ | G02B 13/0045 359/713 |
| 2018/0024322 A1* | 1/2018 | Chen | ................ | H04N 5/2254 359/713 |
| 2019/0121081 A1* | 4/2019 | Huang | ................ | G02B 13/18 |
| 2019/0302426 A1* | 10/2019 | Huang | ................ | G02B 13/0015 |
| 2019/0391367 A1* | 12/2019 | Kuo | ................ | G02B 9/62 |
| 2020/0209541 A1* | 7/2020 | Bian | ................ | G02B 13/0045 |
| 2020/0209590 A1* | 7/2020 | Sun | ................ | G02B 9/62 |
| 2020/0379220 A1* | 12/2020 | Huang | ................ | G02B 9/62 |
| 2021/0356696 A1* | 11/2021 | Kamada | ................ | G02B 13/0045 |
| 2021/0364765 A1* | 11/2021 | Fukaya | ................ | G02B 13/0045 |
| 2021/0364766 A1* | 11/2021 | Fukaya | ................ | G02B 27/0025 |
| 2022/0137370 A1* | 5/2022 | Huang | ................ | G02B 13/0045 348/335 |

FOREIGN PATENT DOCUMENTS

| | | | | |
|---|---|---|---|---|
| CN | 113917666 A | * | 1/2022 | ........ G02B 13/0045 |
| CN | 111221108 B | * | 2/2022 | ........ G02B 13/0045 |
| JP | 2019109485 A | * | 7/2019 | ........ G02B 13/0045 |
| TW | 201534960 A | | 9/2015 | |

* cited by examiner

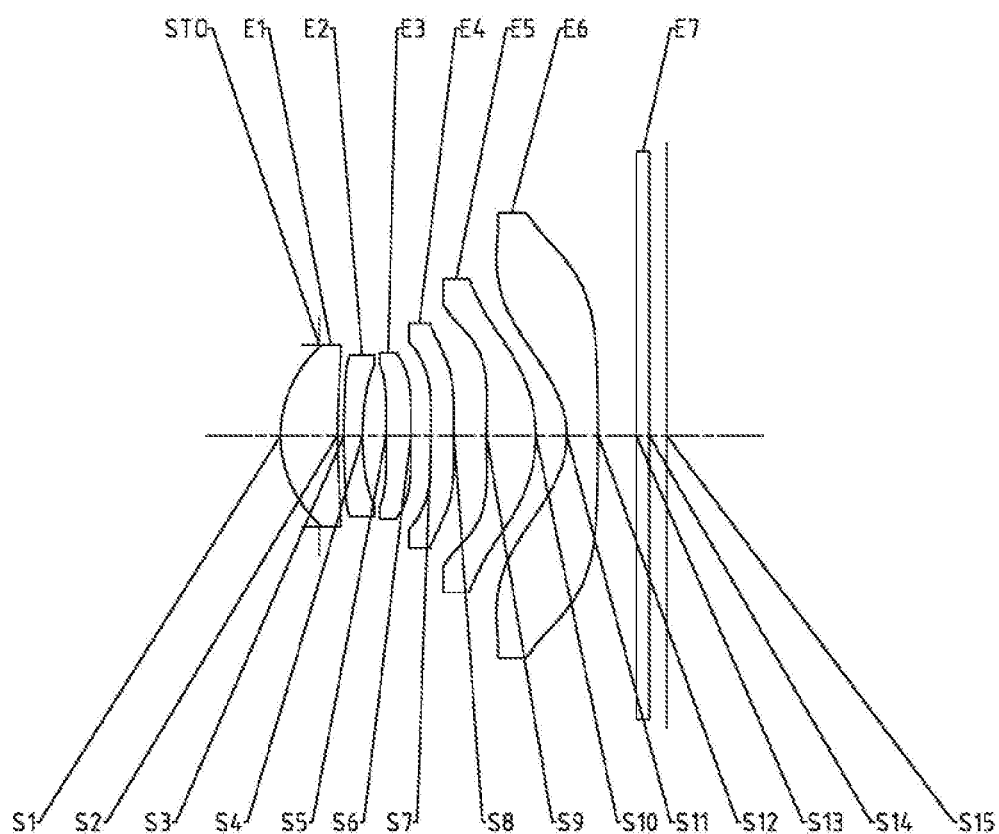
Fig. 5
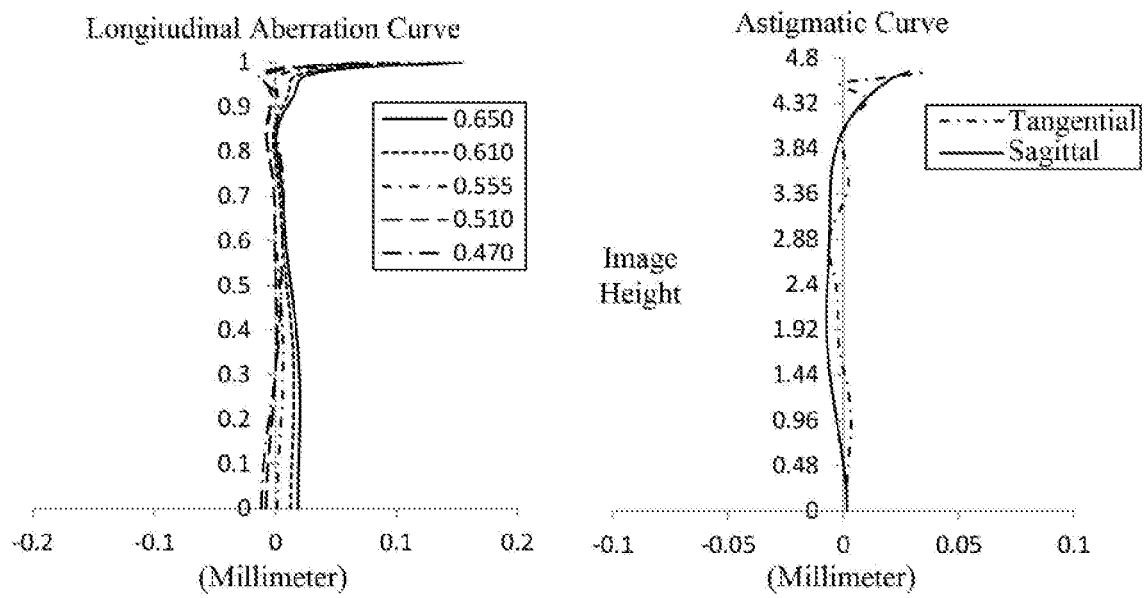
Fig. 6A
Fig. 6B

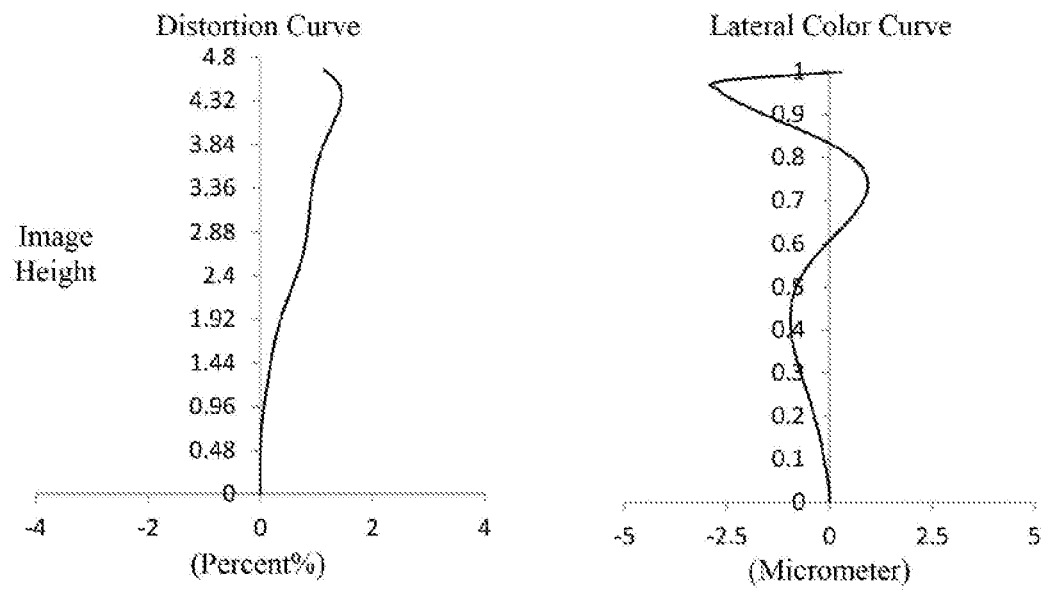
Fig. 6C
Fig. 6D
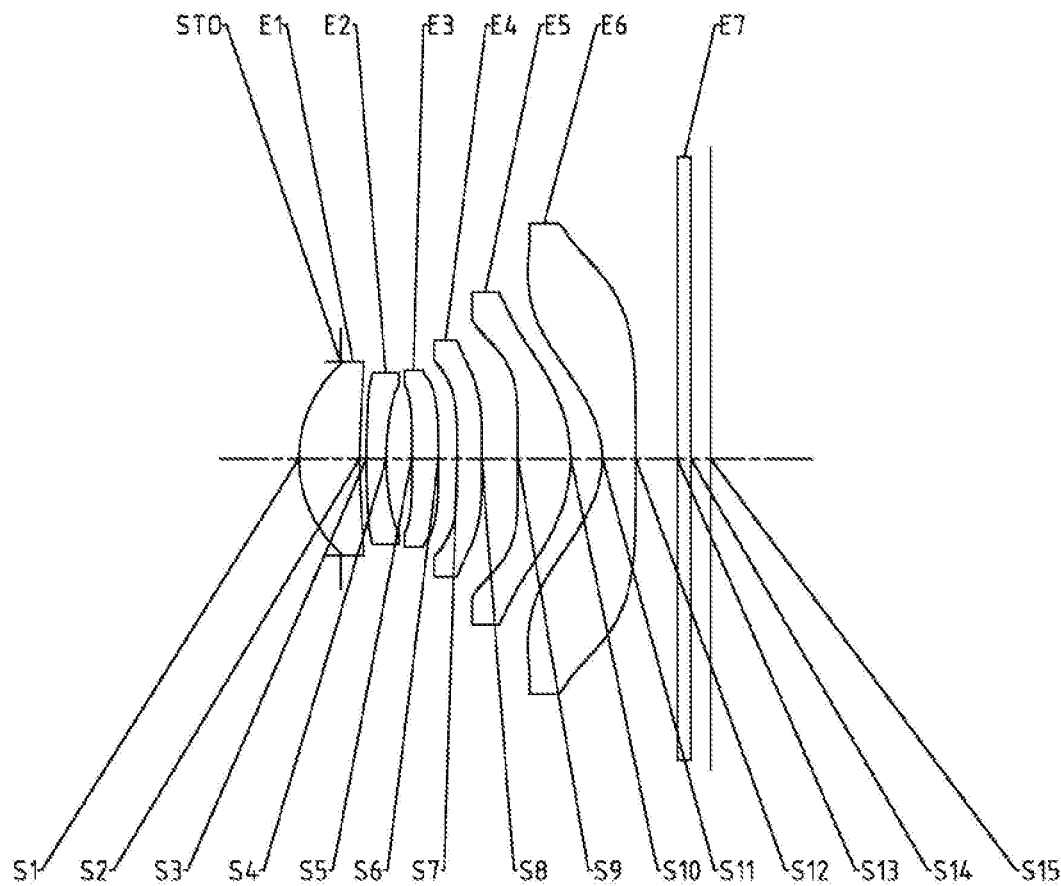
Fig. 7

OPTICAL IMAGING LENS GROUP

CROSS-REFERENCE TO RELATED APPLICATION

This application claims benefit of priority to Chinese Patent Application No. 201910827432.2 filed on Sep. 3, 2019 before the China National Intellectual Property Administration, the entire disclosure of which is incorporated herein by reference in its entity.

TECHNICAL FIELD

The present disclosure relates to the field of optical elements, and specifically, relates to an optical imaging lens group.

BACKGROUND

On the one hand, with the rapid development of portable electronic products, such as smart phones and tablet computers, people have put forward higher and higher demands on the image quality of portable electronic products. On the other hand, with the development of portable electronic products tending to be thinner and lighter, more and more stringent demands have been put forward for the miniaturization of the imaging lens assembly applicable to the portable electronic products.

In order to meet the miniaturization, it is necessary to reduce the number of lenses in the imaging lens group as much as possible. However, the reduction in design freedom caused by the reduction in the number of lenses makes it difficult for the imaging lens group to meet the market's demand for high imaging performance. Moreover, with the improvement of the performance and size reduction of the photosensitive Charge-Coupled Device (CCD) and the Complementary Metal-Oxide Semiconductor (CMOS) image sensors, higher demands are placed on the imaging lens group accordingly.

One of the problems to be solved urgently in the field of lens design is how to achieve an imaging lens group with large-aperture, high-pixel and miniaturization so as to clearly image the object.

SUMMARY

The present disclosure provides an optical imaging lens group which includes, sequentially from an object side to an image side along an optical axis, a first lens having positive refractive power, and an object-side surface thereof is a convex surface; a second lens having refractive power; a third lens having refractive power; a fourth lens having refractive power; a fifth lens having refractive power; and a sixth lens having negative refractive power, an object-side surface thereof is a concave surface, and an image-side surface thereof is a convex surface.

In one embodiment, a total effective focal length f of the optical imaging lens group and an entrance pupil diameter EPD of the optical imaging lens group may satisfy: f/EPD<2.

In one embodiment, a distance TTL along the optical axis from the object-side surface of the first lens to an imaging plane of the optical imaging lens group and half of a diagonal length ImgH of an effective pixel area on the imaging plane of the optical imaging lens group may satisfy: TTL/ImgH<1.4.

In one embodiment, half of a maximal field-of-view Semi-FOV of the optical imaging lens group and a total effective focal length f of the optical imaging lens group may satisfy: f*tan(Semi-FOV)>4.5 mm.

In one embodiment, a total effective focal length f of the optical imaging lens group, an effective focal length f1 of the first lens and an effective focal length f6 of the sixth lens may satisfy: 1<f1/f−f6/f<2.

In one embodiment, a combined focal length f123 of the first lens, the second lens, and the third lens and a combined focal length f45 of the fourth lens and the fifth lens may satisfy: 0.5<f45/f123<1.

In one embodiment, a maximum effective radius DT41 of an object-side surface of the fourth lens and a maximum effective radius DT52 of an image-side surface of the fifth lens may satisfy: 0.3<DT41/DT52<0.8.

In one embodiment, an edge thickness ET1 of the first lens and an edge thickness ET5 of the fifth lens may satisfy: 0.3<ET1/ET5<0.8.

In one embodiment, a distance SAG41 along the optical axis from an intersection of an object-side surface of the fourth lens and the optical axis to a vertex of an effective radius of the object-side surface of the fourth lens and a distance SAG51 along the optical axis from an intersection of an object-side surface of the fifth lens and the optical axis to a vertex of an effective radius of the object-side surface of the fifth lens may satisfy: 0.3<SAG41/SAG51<0.8.

In one embodiment, a distance SAG52 along the optical axis from an intersection of an image-side surface of the fifth lens and the optical axis to a vertex of an effective radius of the image-side surface of the fifth lens and a distance SAG62 along the optical axis from an intersection of the image-side surface of the sixth lens and the optical axis to a vertex of an effective radius of the image-side surface of the sixth lens may satisfy: 0.5<SAG52/SAG62<1.

In one embodiment, a total effective focal length f of the optical imaging lens group and an effective focal length f2 of the second lens may satisfy: −0.8<f/f2<−0.3.

In one embodiment, a radius of curvature R2 of an image-side surface of the first lens and a radius of curvature R3 of an object-side surface of the second lens may satisfy: 0.5<R2/R3<1.

In one embodiment, a radius of curvature R1 of the object-side surface of the first lens and a radius of curvature R4 of an image-side surface of the second lens may satisfy: 0.3<(R4−R1)/(R4+R1)<0.8.

In one embodiment, a radius of curvature R9 of an object-side surface of the fifth lens and a radius of curvature R10 of an image-side surface of the fifth lens may satisfy: 0.5<(R9+R10)/(R9−R10)<1.

In one embodiment, a radius of curvature R11 of the object-side surface of the sixth lens and a radius of curvature R12 of the image-side surface of the sixth lens may satisfy: 0.5<R12/(R11+R12)<1.

In one embodiment, a center thickness CT1 of the first lens along the optical axis and a center thickness CT5 of the fifth lens along the optical axis may satisfy: 0.7<CT5/CT1<1.2.

In one embodiment, a center thickness CT2 of the second lens along the optical axis and a spaced interval T23 between the second lens and the third lens along the optical axis may satisfy: 0.5<CT2/T23<1.

In one embodiment, a spaced interval T34 between the third lens and the fourth lens along the optical axis and a spaced interval T45 between the fourth lens and the fifth lens along the optical axis may satisfy: 0.4<T34/T45<0.9.

In one embodiment, the second lens may have negative refractive power, an object-side surface thereof may be a convex surface, and an image-side surface thereof may be a concave surface; and the fifth lens may have positive refractive power, an object-side surface thereof may be a convex surface, and an image-side surface thereof may be a convex surface.

The present disclosure employs a plurality of lenses (for example, six lenses), and the optical imaging lens group has at least one advantageous effect such as miniaturization, large aperture and high image quality and the like by rationally configuring the refractive power, the surface shape, the center thickness of each lens, and the on-axis spaced interval between the lenses and the like.

BRIEF DESCRIPTION OF THE DRAWINGS

Other features, objects, and advantages of the present disclosure will become more apparent by reading the detailed description of the non-limiting embodiments with reference to the accompanying drawings:

FIG. 5 illustrates a schematic structural view of an optical imaging lens group according to Example 3 of the present disclosure;

FIGS. 6A to 6D illustrate a longitudinal aberration curve, an astigmatic curve, a distortion curve, and a lateral color curve of the optical imaging lens group of the Example 3, respectively;

FIG. 7 illustrates a schematic structural view of an optical imaging lens group according to Example 4 of the present disclosure;

DETAILED DESCRIPTION OF EMBODIMENTS

Figure 1:
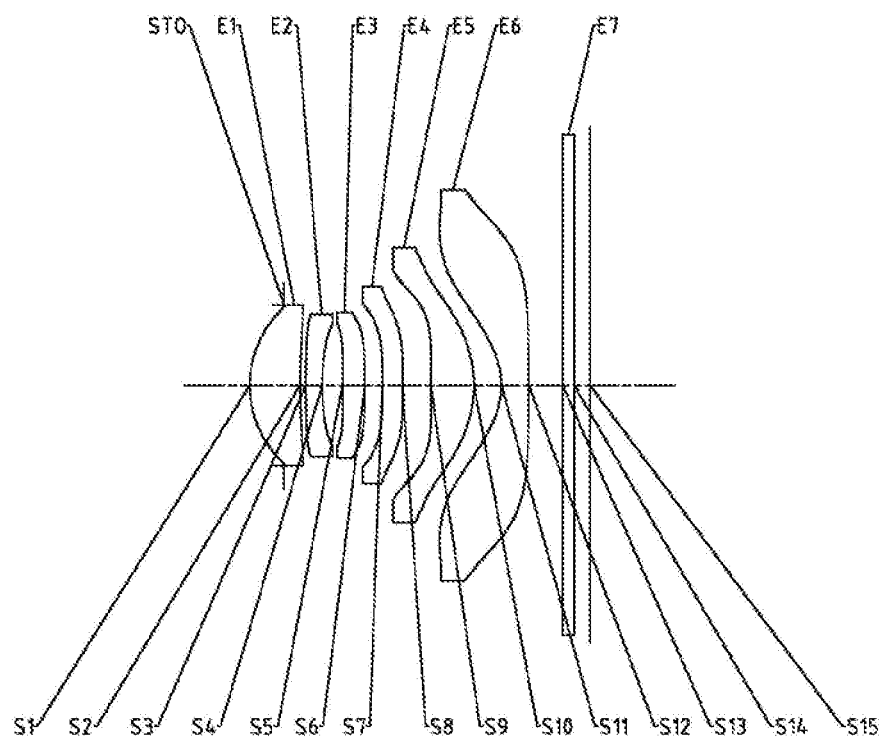
FIG. 1 illustrates a schematic structural view of an optical imaging lens group according to Example 1 of the present disclosure.

For a better understanding of the present disclosure, various aspects of the present disclosure will be described in more detail with reference to the accompanying drawings. It should be understood that the detailed description is merely illustrative of the exemplary embodiments of the present disclosure and is not intended to limit the scope of the present disclosure in any way. Throughout the specification, the same reference numerals refer to the same elements. The expression "and/or" includes any and all combinations of one or more of the associated listed items.

It should be noted that in the present specification, the expressions such as first, second, third are used merely for distinguishing one feature from another, without indicating any limitation on the features. Thus, a first lens discussed below may also be referred to as a second lens or a third lens without departing from the teachings of the present disclosure.

In the accompanying drawings, the thickness, size and shape of the lens have been somewhat exaggerated for the convenience of explanation. In particular, shapes of spherical surfaces or aspheric surfaces shown in the accompanying drawings are shown by way of example. That is, shapes of the spherical surfaces or the aspheric surfaces are not limited to the shapes of the spherical surfaces or the aspheric surfaces shown in the accompanying drawings. The accompanying drawings are merely illustrative and not strictly drawn to scale.

Herein, the paraxial area refers to an area near the optical axis. If a surface of a lens is a convex surface and the position of the convex is not defined, it indicates that the surface of the lens is convex at least in the paraxial region; and if a surface of a lens is a concave surface and the position of the concave is not defined, it indicates that the surface of the lens is concave at least in the paraxial region. In each lens, the surface closest to the object is referred to as an object-side surface of the lens, and the surface closest to the imaging plane is referred to as an image-side surface of the lens.

It should be further understood that the terms "comprising," "including," "having," "containing" and/or "contain," when used in the specification, specify the presence of stated features, elements and/or components, but do not exclude the presence or addition of one or more other features, elements, components and/or combinations thereof. In addition, expressions, such as "at least one of," when preceding a list of features, modify the entire list of features rather than an individual element in the list. Further, the use of "may," when describing embodiments of the present disclosure, refers to "one or more embodiments of the present disclosure." Also, the term "exemplary" is intended to refer to an example or illustration.

Unless otherwise defined, all terms (including technical and scientific terms) used herein have the same meaning as commonly understood by those of ordinary skill in the art to which the present disclosure belongs. It will be further understood that terms, such as those defined in commonly used dictionaries, should be interpreted as having a meaning that is consistent with the meaning in the context of the relevant art and will not be interpreted in an idealized or overly formal sense, unless expressly so defined herein.

It should also be noted that, the examples in the present disclosure and the features in the examples may be combined with each other on a non-conflict basis. The present disclosure will be described in detail below with reference to the accompanying drawings and in combination with the examples.

The features, principles, and other aspects of the present disclosure are described in detail below.

An optical imaging lens group according to an exemplary embodiment of the present disclosure may include six lenses having refractive power, which are a first lens, a second lens, a third lens, a fourth lens, a fifth lens and a sixth lens. The six lenses are arranged sequentially from an object side to an image side along an optical axis. Among the first lens to the sixth lens, there may be a spaced interval between each two adjacent lenses.

In an exemplary embodiment, the first lens may have positive refractive power, and an object-side surface thereof may be a convex surface; the second lens has refractive power; the third lens has refractive power; the fourth lens has refractive power; the fifth lens has refractive power; and the sixth lens may have negative refractive power, an object-side surface thereof may be a concave surface, and an image-side surface thereof may be a convex surface.

In an exemplary embodiment, the second lens may have negative refractive power, an object-side surface thereof may be a convex surface, and an image-side surface thereof may be a concave surface; the fifth lens may have positive refractive power, an object-side surface thereof may be a convex surface, and an image-side surface thereof may be a convex surface. Reasonably controlling the refractive power and surface shape of the second lens and the fifth lens is beneficial to compensate the spherical aberration generated by the second lens and the fifth lens, thereby enabling the optical imaging lens group to have better resolution.

In an exemplary embodiment, the optical imaging lens group according to the present disclosure may satisfy: $f/EPD<2$, where f is a total effective focal length of the optical imaging lens group, and EPD is an entrance pupil diameter of the optical imaging lens group. More specifically, f and EPD may further satisfy: $f/EPD<1.95$. By reasonably assigning the refractive power, the F number of the optical imaging lens group including six plastic lenses may be less than 2, so that the optical imaging lens group has the characteristic of large aperture.

In an exemplary embodiment, the optical imaging lens group according to the present disclosure may satisfy: $TTL/ImgH<1.4$, where TTL is a distance along the optical axis from the object-side surface of the first lens to an imaging plane of the optical imaging lens group, and ImgH is half of a diagonal length of an effective pixel area on the imaging plane of the optical imaging lens group. Satisfying $TTL/ImgH<1.4$ may ensure that the optical imaging lens group can be applied to the photosensitive Charge-Coupled Device (CCD) with a large image plane.

In an exemplary embodiment, the optical imaging lens group according to the present disclosure may satisfy: $f*\tan(\text{Semi-FOV})>4.5$ mm, where Semi-FOV is half of a maximal field-of-view of the optical imaging lens group, and f is a total effective focal length of the optical imaging lens group. More specifically, f and Semi-FOV may further satisfy: $f*\tan(\text{Semi-FOV})>4.6$ mm. When $f*\tan(\text{Semi-FOV})>4.5$ mm is satisfied, the optical imaging lens group may have a relative large image plane.

In an exemplary embodiment, the optical imaging lens group according to the present disclosure may satisfy: $1<f1/f-f6/f<2$, where f is a total effective focal length of the optical imaging lens group, f1 is an effective focal length of the first lens, and f6 is an effective focal length of the sixth lens. More specifically, f1, f and f6 may further satisfy: $1.1<f1/f-f6/f<1.5$. Reasonably configuring the refractive powers of the first lens, the sixth lens and the lens group is not only beneficial to correct the chromatic aberration of the optical imaging lens group, but also beneficial to correct the curvature of field of the optical imaging lens group.

In an exemplary embodiment, the optical imaging lens group according to the present disclosure may satisfy: $0.5<f45/f123<1$, where f123 is a combined focal length of the first lens, the second lens, and the third lens, and f45 is a combined focal length of the fourth lens and the fifth lens. More specifically, f45 and f123 may further satisfy: $0.5<f45/f123<0.9$. Reasonably configuring the combined refractive power of the two lens groups may effectively compensate the aberrations of the optical imaging lens groups, thereby obtaining good image quality.

In an exemplary embodiment, the optical imaging lens group according to the present disclosure may satisfy: $0.3<DT41/DT52<0.8$, where DT41 is a maximum effective radius of an object-side surface of the fourth lens, and DT52 is a maximum effective radius of an image-side surface of the fifth lens. When $0.3<DT41/DT52<0.8$ is satisfied, the size of the optical imaging lens group may be advantageously reduced, the miniaturization of the optical imaging lens group may be achieved, and the resolution of the optical imaging lens group may be improved.

In an exemplary embodiment, the optical imaging lens group according to the present disclosure may satisfy: $0.3<ET1/ET5<0.8$, where ET1 is an edge thickness of the first lens, and ET5 is an edge thickness of the fifth lens. More specifically, ET1 and ET5 may further satisfy: $0.4<ET1/ET5<0.8$. Satisfying $0.3<ET1/ET5<0.8$ may be beneficial to reasonably adjust the amount of distortion of the optical imaging lens group. Finally, the amount of distortion of the optical imaging lens group is controlled within a certain range.

In an exemplary embodiment, the optical imaging lens group according to the present disclosure may satisfy: $0.3<SAG41/SAG51<0.8$, where SAG41 is a distance along the optical axis from an intersection of an object-side surface of the fourth lens and the optical axis to a vertex of an effective radius of the object-side surface of the fourth lens, and SAG51 is a distance along the optical axis from an intersection of an object-side surface of the fifth lens and the optical axis to a vertex of an effective radius of the object-side surface of the fifth lens. More specifically, SAG41 and SAG51 may further satisfy: $0.4<SAG41/SAG51<0.7$. When $0.3<SAG41/SAG51<0.8$ is satisfied, it is not only beneficial to ensure the workability of the fourth lens and the fifth lens, but also beneficial to achieve the molding and assembly of the fourth lens and the fifth lens, so as to obtain good image quality. However, if the ratio of SAG41 to SAG51 is in an unreasonable range, it may cause difficulty in adjusting the molded surface and obvious deformation after assembly, such that the image quality cannot be guaranteed.

In an exemplary embodiment, the optical imaging lens group according to the present disclosure may satisfy: $0.5<SAG52/SAG62<1$, where SAG52 is a distance along the optical axis from an intersection of an image-side surface of the fifth lens and the optical axis to a vertex of an effective radius of the image-side surface of the fifth lens, and SAG62 is a distance along the optical axis from an intersection of the image-side surface of the sixth lens and the optical axis to a vertex of an effective radius of the image-side surface of the sixth lens. More specifically, SAG52 and SAG62 may further satisfy: $0.7<SAG52/SAG62<1$. When $0.5<SAG52/SAG62<1$ is satisfied, it is not only beneficial to ensure the workability of the fifth lens and the sixth lens, but also beneficial to achieve the molding and assembly of the fifth lens and the sixth lens, so as to obtain a good image quality.

In an exemplary embodiment, the optical imaging lens group according to the present disclosure may satisfy: $-0.8<f/f2<-0.3$, where f is a total effective focal length of the optical imaging lens group, and f2 is an effective focal length of the second lens. More specifically, f and f2 may further satisfy: $-0.7<f/f2<-0.4$. When $-0.8<f/f2<-0.3$ is satisfied, the second lens may contribute reasonable negative third-order spherical aberration and positive fifth-order spherical aberration, which offset the positive third-order spherical aberration and the negative fifth-order spherical aberration generated by other positive refractive lenses, thereby ensuring that the optical imaging lens group obtains good image quality at the on-axis field-of-view.

In an exemplary embodiment, the optical imaging lens group according to the present disclosure may satisfy: $0.5<R2/R3<1$, where R2 is a radius of curvature of an image-side surface of the first lens, and R3 is a radius of curvature of an object-side surface of the second lens. More specifically, R2 and R3 may further satisfy: $0.6<R2/R3<0.9$. Satisfying $0.5<R2/R3<1$ may control the spherical aberration of the optical imaging lens group within a reasonable range, thereby obtaining good image quality.

In an exemplary embodiment, the optical imaging lens group according to the present disclosure may satisfy: $0.3<(R4-R1)/(R4+R1)<0.8$, where R1 is a radius of curvature of the object-side surface of the first lens, and R4 is a radius of curvature of an image-side surface of the second lens. More specifically, R4 and R1 may further satisfy: $0.3<(R4-R1)/(R4+R1)<0.6$. Satisfying $0.3<(R4-R1)/(R4+R1)<0.8$ may effectively reduce the spherical aberration and chromatic aberration of the optical imaging lens group, thereby improving the image quality of the optical imaging lens group.

In an exemplary embodiment, the optical imaging lens group according to the present disclosure may satisfy: $0.5<(R9+R10)/(R9-R10)<1$, where R9 is a radius of curvature of an object-side surface of the fifth lens, and R10 is a radius of curvature of an image-side surface of the fifth lens. More specifically, R9 and R10 may further satisfy: $0.6<(R9+R10)/(R9-R10)<0.9$. By satisfying $0.5<(R9+R10)/(R9-R10)<1$, the shape of the fifth lens may be effectively constrained, and the coma contribution of the fifth lens may be controlled within a reasonable range, such that the image quality at the on-axis and off-axis field-of-view of the optical imaging lens group will not be obviously degraded due to the coma generated by the fifth lens.

In an exemplary embodiment, the optical imaging lens group according to the present disclosure may satisfy: $0.5<R12/(R11+R12)<1$, where R11 is a radius of curvature of the object-side surface of the sixth lens, and R12 is a radius of curvature of the image-side surface of the sixth lens. More specifically, R11 and R12 may further satisfy: $0.8<R12/(R11+R12)<1$. Satisfying $0.5<R12/(R11+R12)<1$ may be beneficial to control the coma contribution of the sixth lens within a reasonable range, and then may well compensate the coma generated by the front lenses to obtain good image quality.

In an exemplary embodiment, the optical imaging lens group according to the present disclosure may satisfy: $0.7<CT5/CT1<1.2$, where CT1 is a center thickness of the first lens along the optical axis, and CT5 is a center thickness of the fifth lens along the optical axis. More specifically, CT5 and CT1 may further satisfy: $0.8<CT5/CT1<1.1$. By satisfying $0.7<CT5/CT1<1.2$, the distortion contribution of the first lens and the fifth lens may be controlled within a reasonable range, thereby improving the resolution of the optical imaging lens group.

In an exemplary embodiment, the optical imaging lens group according to the present disclosure may satisfy: $0.5<CT2/T23<1$, where CT2 is a center thickness of the second lens along the optical axis, and T23 is a spaced interval between the second lens and the third lens along the optical axis. More specifically, CT2 and T23 may further satisfy: $0.6<CT2/T23<0.9$. Satisfying $0.5<CT2/T23<1$ may effectively ensure the field curvature and distortion of the optical imaging lens group, and thereby make the optical imaging lens group have good image quality at the off-axis field.

In an exemplary embodiment, the optical imaging lens group according to the present disclosure may satisfy: $0.4<T34/T45<0.9$, where T34 is a spaced interval between the third lens and the fourth lens along the optical axis, and T45 is a spaced interval between the fourth lens and the fifth lens along the optical axis. More specifically, T34 and T45 may further satisfy: $0.4<T34/T45<0.8$. When $0.4<T34/T45<0.9$ is satisfied, the air interval between the third lens and the fourth lens and the air interval between the fourth lens and the fifth lens may be within a reasonable range, so that the optical imaging lens group may be compact in structure, thereby obtaining good process ability.

In an exemplary embodiment, the optical imaging lens group according to the present disclosure further includes a stop disposed between the object side and the first lens. Optionally, the above optical imaging lens group may further include an optical filter for correcting the color deviation and/or a protective glass for protecting the photosensitive element located on an imaging plane.

The optical imaging lens group according to the above embodiments of the present disclosure may employ a plurality of lenses, such as six lenses as described above. By properly configuring the refractive power of each lens, the surface shape, the center thickness of each lens, and spaced intervals along the optical axis between the lenses, the size of the optical imaging lens group may be effectively reduced, and the workability of the optical imaging lens group may be improved, such that the optical imaging lens group is more advantageous for production processing and may be applied to portable electronic products. The optical imaging lens group configured as described above may have characteristics such as ultra-thin, large aperture, large image plane, and good image quality.

In the embodiments of the present disclosure, at least one of the surfaces of lenses is aspheric, that is, at least one of the object-side surface of the first lens to the image-side surface of the sixth lens is aspheric. The aspheric lens is characterized by a continuous change in curvature from the center of the lens to the periphery of the lens. Unlike a spherical lens having a constant curvature from the center of the lens to the periphery of the lens, the aspheric lens has a better curvature radius characteristic, and has the advantages of improving distortion aberration and improving astigmatic aberration. With aspheric lens, the aberrations that occur during imaging may be eliminated as much as possible, and thus improving the image quality. Optionally, at least one of the object-side surface and the image-side surface of each of the first lens, the second lens, the third lens, the fourth lens, the fifth lens and the sixth lens is aspheric. Optionally, the object-side surface and the image-side surface of each of the first lens, the second lens, the third lens, the fourth lens, the fifth lens and the sixth lens are aspheric.

However, it will be understood by those skilled in the art that the number of lenses constituting the optical imaging lens group may be varied to achieve the various results and advantages described in this specification without departing from the technical solution claimed by the present disclosure. For example, although the embodiment is described by taking six lenses as an example, the optical imaging lens group is not limited to include six lenses. The optical imaging lens group may also include other numbers of lenses if desired.

Some specific examples of an optical imaging lens group applicable to the above embodiment will be further described below with reference to the accompanying drawings.

EXAMPLE 1

An optical imaging lens group according to example 1 of the present disclosure is described below with reference to FIG. 1 to FIG. 2D. FIG. 1 shows a schematic structural view of the optical imaging lens group according to example 1 of the present disclosure.

As shown in FIG. 1, the optical imaging lens group includes a stop STO, a first lens E1, a second lens E2, a third lens E3, a fourth lens E4, a fifth lens E5, a sixth lens E6, an optical filter E7 and an imaging plane S15, which are sequentially arranged from an object side to an image side.

The first lens E1 has positive refractive power, an object-side surface S1 thereof is a convex surface, and an image-side surface S2 thereof is a concave surface. The second lens E2 has negative refractive power, an object-side surface S3 thereof is a convex surface, and an image-side surface S4 thereof is a concave surface. The third lens E3 has positive refractive power, an object-side surface S5 thereof is a convex surface, and an image-side surface S6 thereof is a convex surface. The fourth lens E4 has negative refractive power, an object-side surface S7 thereof is a convex surface, and an image-side surface S8 thereof is a concave surface. The fifth lens E5 has positive refractive power, an object-side surface S9 thereof is a convex surface, and an image-side surface S10 thereof is a convex surface. The sixth lens E6 has negative refractive power, an object-side surface S11 thereof is a concave surface, and an image-side surface S12 thereof is a convex surface. The optical filter E7 has an object-side surface S13 and an image-side surface S14. Light from an object sequentially passes through the respective surfaces S1 to S14 and is finally imaged on the imaging plane S15.

Table 1 is a table illustrating basic parameters of the optical imaging lens group of example 1, wherein the units for the radius of curvature, the thickness/distance and the focal length are millimeter (mm).

TABLE 1

| Surface number | Surface type | Radius of curvature | Thickness/ Distance | Material Refractive index | Abbe number | Focal length | Conic coefficient |
|---|---|---|---|---|---|---|---|
| OBJ | Spherical | Infinite | Infinite | | | | |
| STO | Spherical | Infinite | −0.6269 | | | | |
| S1 | Aspheric | 1.9379 | 0.9177 | 1.55 | 56.1 | 4.33 | 0.0030 |
| S2 | Aspheric | 8.9240 | 0.1064 | | | | −99.0000 |
| S3 | Aspheric | 11.1287 | 0.3000 | 1.67 | 19.2 | −10.08 | 60.8177 |
| S4 | Aspheric | 4.1871 | 0.3700 | | | | 2.7436 |
| S5 | Aspheric | 32.6072 | 0.4056 | 1.55 | 56.1 | 59.16 | 82.3359 |
| S6 | Aspheric | −3404.8439 | 0.3199 | | | | 98.0000 |
| S7 | Aspheric | 45.8271 | 0.3700 | 1.67 | 20.4 | −109.58 | −74.8105 |
| S8 | Aspheric | 28.0669 | 0.5173 | | | | 0.0000 |
| S9 | Aspheric | 16.3231 | 0.7882 | 1.55 | 56.1 | 3.66 | −73.9863 |
| S10 | Aspheric | −2.2357 | 0.5037 | | | | −0.7945 |
| S11 | Aspheric | −1.3682 | 0.4995 | 1.54 | 55.9 | −2.68 | −3.0434 |
| S12 | Aspheric | −32.0560 | 0.6206 | | | | 59.0515 |
| S13 | Spherical | Infinite | 0.2100 | 1.52 | 64.2 | | |
| S14 | Spherical | Infinite | 0.2862 | | | | |
| S15 | Spherical | Infinite | | | | | |

In this example, a total effective focal length f of the optical imaging lens group is 5.53 mm, a total length TTL of the optical imaging lens group (that is, a distance along the optical axis from the object-side surface S1 of the first lens E1 to the imaging surface S15 of the optical imaging lens group) is 6.22 mm, half of a diagonal length ImgH of an effective pixel area on the imaging plane S15 of the optical imaging lens group is 4.71 mm, and half of a maximal field-of-view Semi-FOV of the optical imaging lens group is 40.2°.

In example 1, the object-side surface and the image-side surface of any one of the first lens E1 to the sixth lens E6 are aspheric. The surface shape x of each aspheric lens may be defined by using, but not limited to, the following aspheric formula:

$$h = \frac{ch^2}{1+\sqrt{1-(k+1)c^2h^2}} + \sum A_i h^i \quad (1)$$

Where, x is the sag—the axis-component of the displacement of the surface from the aspheric vertex, when the surface is at height h from the optical axis; c is a paraxial curvature of the aspheric surface, c=1/R (that is, the paraxial curvature c is reciprocal of the radius of curvature R in the above Table 1); k is a conic coefficient; Ai is a correction coefficient for the i-th order of the aspheric surface. Table 2 below shows high-order coefficients A4, A6, A8, A10, A12, A14, A16, A18 and A20 applicable to each aspheric surface S1 to S12 in example 1.

TABLE 2

| Surface number | A4 | A6 | A8 | A10 | A12 | A14 | A16 | A18 | A20 |
|---|---|---|---|---|---|---|---|---|---|
| S1 | 1.5326E−03 | −8.5588E−03 | 3.2566E−02 | −6.4599E−02 | 7.5740E−02 | −5.3991E−02 | 2.2849E−02 | −5.2708E−03 | 5.0345E−04 |
| S2 | −2.5363E−02 | 1.2089E−02 | 6.6068E−02 | −1.7510E−01 | 2.2724E−01 | −1.7642E−01 | 8.1824E−02 | −2.0882E−02 | 2.2553E−03 |
| S3 | −7.2632E−02 | 8.8957E−02 | −5.6239E−02 | 3.7385E−02 | −4.9016E−02 | 5.5429E−02 | −3.6044E−02 | 1.2293E−02 | −1.7110E−03 |
| S4 | −3.2370E−02 | 2.5938E−02 | 2.2243E−01 | −8.9022E−01 | 1.9293E+00 | −2.5512E+00 | 2.0249E+00 | −8.8251E−01 | 1.6252E−01 |
| S5 | −6.0923E−02 | −2.8781E−02 | 2.6919E−01 | −1.0164E+00 | 2.1250E+00 | −2.6991E+00 | 2.0581E+00 | −8.6827E−01 | 1.5603E−01 |
| S6 | −8.1241E−02 | 4.2987E−02 | −5.8281E−02 | 3.6326E−02 | 6.7611E−03 | −4.3180E−02 | 4.3080E−02 | −1.9890E−02 | 3.6763E−03 |
| S7 | −1.2332E−01 | 8.2945E−02 | −1.0545E−01 | 1.1285E−01 | −9.2535E−02 | 5.3844E−02 | −2.0116E−02 | 4.2170E−03 | −3.7570E−04 |
| S8 | −1.1913E−01 | 7.7983E−02 | −8.3687E−02 | 7.6652E−02 | −5.0416E−02 | 2.2826E−02 | −6.5447E−03 | 1.0549E−03 | −7.2602E−05 |
| S9 | −5.3717E−02 | −5.8393E−04 | 9.0888E−03 | −1.4563E−02 | 1.0089E−02 | −3.8505E−03 | 8.4586E−04 | −9.8107E−05 | 4.5750E−06 |
| S10 | 6.7889E−03 | −1.4698E−02 | 1.6210E−02 | −1.1033E−02 | 4.5705E−03 | −1.0882E−03 | 1.4634E−04 | −1.0377E−05 | 3.0213E−07 |
| S11 | −4.3221E−02 | 2.0084E−02 | −5.5993E−03 | 1.5342E−03 | −3.1706E−04 | 4.1358E−05 | −3.2061E−06 | 1.3565E−07 | −2.4226E−09 |
| S12 | 1.1088E−02 | −1.1226E−02 | 4.5860E−03 | −1.2415E−03 | 2.1662E−04 | −2.4089E−05 | 1.6381E−06 | −6.1426E−08 | 9.6420E−10 |

Figure 2A:
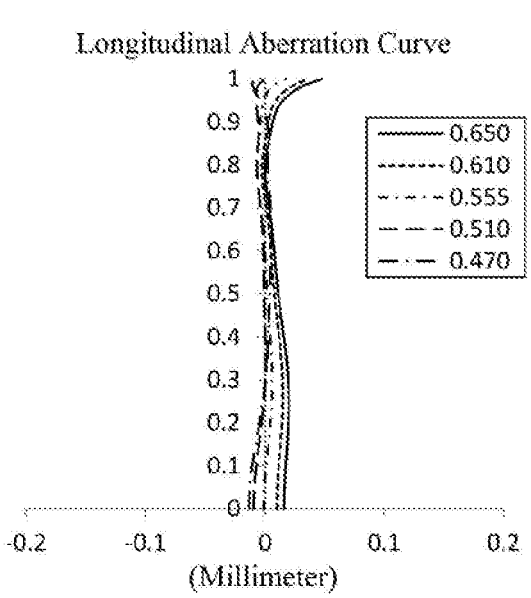
FIGS. 2A to 2D illustrate a longitudinal aberration curve, an astigmatic curve, a distortion curve, and a lateral color curve of the optical imaging lens group of the Example 1, respectively.
Figure 2B:
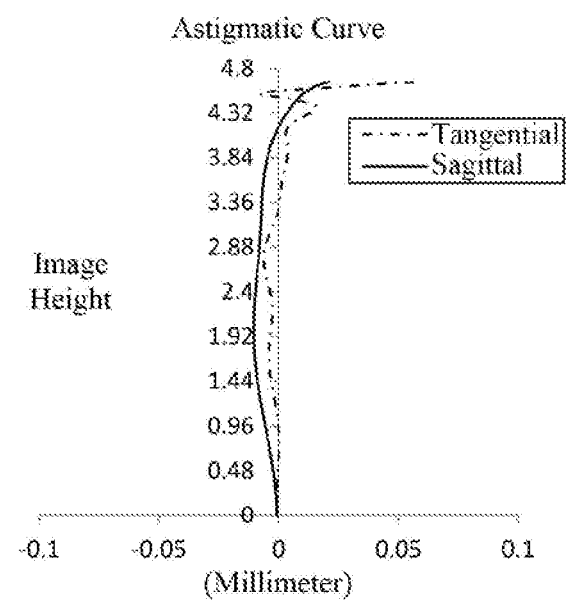
Figure 2C:
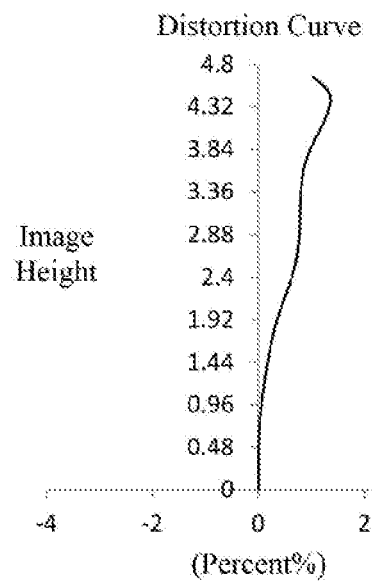
Figure 2D:
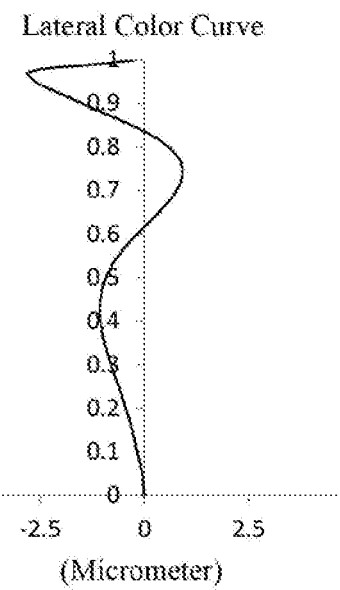

FIG. 2A illustrates a longitudinal aberration curve of the optical imaging lens group according to example 1, representing deviations of focal points converged by light of different wavelengths after passing through the lens assembly. FIG. 2B illustrates an astigmatic curve of the optical imaging lens group according to example 1, representing a curvature of a tangential plane and a curvature of a sagittal plane. FIG. 2C illustrates a distortion curve of the optical imaging lens group according to example 1, representing amounts of distortion corresponding to different image heights. FIG. 2D illustrates a lateral color curve of the optical imaging lens group according to example 1, representing deviations of different image heights on an imaging plane after light passes through the lens assembly. It can be seen from FIG. 2A to FIG. 2D that the optical imaging lens group provided in example 1 may achieve good image quality.

EXAMPLE 2

Figure 3:
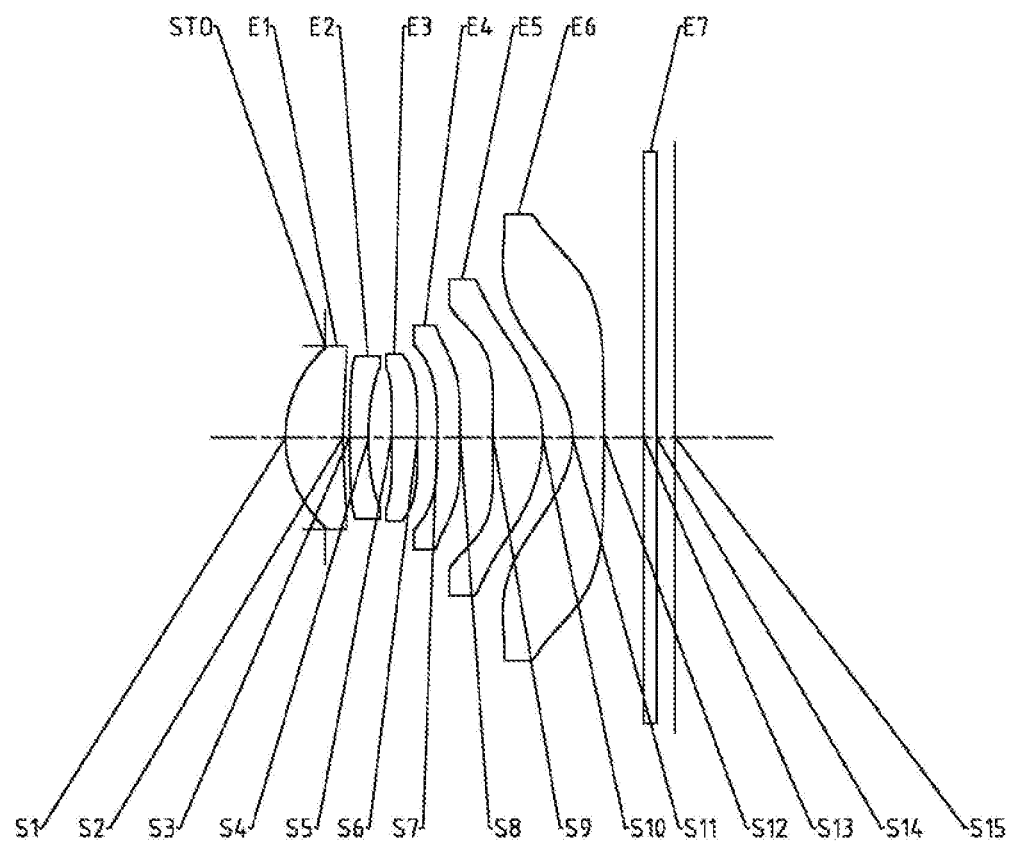
FIG. 3 illustrates a schematic structural view of an optical imaging lens group according to Example 2 of the present disclosure.

An optical imaging lens group according to example 2 of the present disclosure is described below with reference to FIG. 3 to FIG. 4D. In this example and the following examples, for the purpose of brevity, the description of parts similar to those in example 1 will be omitted. FIG. 3 shows a schematic structural view of the optical imaging lens group according to example 2 of the present disclosure.

As shown in FIG. 3, the optical imaging lens group includes a stop STO, a first lens E1, a second lens E2, a third lens E3, a fourth lens E4, a fifth lens E5, a sixth lens E6, an optical filter E7 and an imaging plane S15, which are sequentially arranged from an object side to an image side.

The first lens E1 has positive refractive power, an object-side surface S1 thereof is a convex surface, and an image-side surface S2 thereof is a concave surface. The second lens E2 has negative refractive power, an object-side surface S3 thereof is a convex surface, and an image-side surface S4 thereof is a concave surface. The third lens E3 has positive refractive power, an object-side surface S5 thereof is a convex surface, and an image-side surface S6 thereof is a convex surface. The fourth lens E4 has negative refractive power, an object-side surface S7 thereof is a convex surface, and an image-side surface S8 thereof is a concave surface. The fifth lens E5 has positive refractive power, an object-side surface S9 thereof is a convex surface, and an image-side surface S10 thereof is a convex surface. The sixth lens E6 has negative refractive power, an object-side surface S11 thereof is a concave surface, and an image-side surface S12 thereof is a convex surface. The optical filter E7 has an object-side surface S13 and an image-side surface S14. Light from an object sequentially passes through the respective surfaces S1 to S14 and is finally imaged on the imaging plane S15.

In this example, a total effective focal length f of the optical imaging lens group is 5.53 mm, a total length TTL of the optical imaging lens group is 6.22 mm, half of a diagonal length ImgH of an effective pixel area on the imaging plane S15 of the optical imaging lens group is 4.71 mm, and half of a maximal field-of-view Semi-FOV of the optical imaging lens group is 40.2°.

Table 3 is a table illustrating basic parameters of the optical imaging lens group of example 2, wherein the units for the radius of curvature, the thickness/distance and the focal length are millimeter (mm). Table 4 shows high-order coefficients applicable to each aspheric surface in example 2, wherein the surface shape of each aspheric surface may be defined by the formula (1) given in the above example 1.

TABLE 3

| Surface number | Surface type | Radius of curvature | Thickness/ Distance | Material | | Focal length | Conic coefficient |
| | | | | Refractive index | Abbe number | | |
|---|---|---|---|---|---|---|---|
| OBJ | Spherical | Infinite | Infinite | | | | |
| STO | Spherical | Infinite | −0.6281 | | | | |
| S1 | Aspheric | 1.9353 | 0.9183 | 1.55 | 56.1 | 4.33 | 0.0519 |
| S2 | Aspheric | 8.8587 | 0.1049 | | | | −97.5379 |
| S3 | Aspheric | 11.2489 | 0.3000 | 1.67 | 19.2 | −10.20 | 61.5141 |
| S4 | Aspheric | 4.2357 | 0.3720 | | | | 2.9043 |
| S5 | Aspheric | 31.3579 | 0.4075 | 1.55 | 56.1 | 55.87 | 57.9145 |
| S6 | Aspheric | −1110.7200 | 0.3142 | | | | 98.0000 |
| S7 | Aspheric | 185.3384 | 0.3700 | 1.67 | 20.4 | −96.77 | 48.7500 |
| S8 | Aspheric | 47.8061 | 0.5194 | | | | 0.0000 |
| S9 | Aspheric | 15.0356 | 0.7947 | 1.55 | 56.1 | 3.57 | −79.9737 |
| S10 | Aspheric | −2.1944 | 0.4786 | | | | −0.8121 |

TABLE 3-continued

| Surface number | Surface type | Radius of curvature | Thickness/ Distance | Material Refractive index | Abbe number | Focal length | Conic coefficient |
|---|---|---|---|---|---|---|---|
| S11 | Aspheric | −1.3535 | 0.4996 | 1.54 | 55.9 | −2.62 | −3.0506 |
| S12 | Aspheric | −41.5514 | 0.6301 | | | | 95.3686 |
| S13 | Spherical | Infinite | 0.2100 | 1.52 | 64.2 | | |
| S14 | Spherical | Infinite | 0.2957 | | | | |
| S15 | Spherical | Infinite | | | | | |

TABLE 4

| Surface number | A4 | A6 | A8 | A10 | A12 | A14 | A16 | A18 | A20 |
|---|---|---|---|---|---|---|---|---|---|
| S1 | 5.9478E−04 | −7.8233E−03 | 2.8839E−02 | −5.6611E−02 | 6.5489E−02 | −4.6110E−02 | 1.9263E−02 | −4.3807E−03 | 4.1014E−04 |
| S2 | −2.5842E−02 | 1.3530E−02 | 6.3401E−02 | −1.7194E−01 | 2.2652E−01 | −1.7839E−01 | 8.3754E−02 | −2.1569E−02 | 2.3407E−03 |
| S3 | −7.3453E−02 | 9.0570E−02 | −5.8698E−02 | 4.5180E−02 | −6.3493E−02 | 7.0927E−02 | −4.5834E−02 | 1.5706E−02 | −2.2187E−03 |
| S4 | −3.3173E−02 | 2.4386E−02 | 2.3293E−01 | −9.1699E−01 | 1.9694E+00 | −2.5852E+00 | 2.0379E+00 | −8.8204E−01 | 1.6124E−01 |
| S5 | −6.2444E−02 | −1.9188E−02 | 2.1211E−01 | −8.1849E−01 | 1.7048E+00 | −2.1464E+00 | 1.6209E+00 | −6.7825E−01 | 1.2124E−01 |
| S6 | −8.2741E−02 | 5.2851E−02 | −9.6279E−02 | 1.1885E−01 | −1.0691E−01 | 5.6755E−02 | −1.1427E−02 | −3.0364E−03 | 1.4238E−03 |
| S7 | −1.2602E−01 | 1.0124E−01 | −1.6658E−01 | 2.2685E−01 | −2.2444E−01 | 1.4916E−01 | −6.2229E−02 | 1.4694E−02 | −1.5011E−03 |
| S8 | −1.2010E−01 | 8.6698E−02 | −1.0382E−01 | 1.0159E−01 | −6.8863E−02 | 3.1018E−02 | −8.6700E−03 | 1.3539E−03 | −9.0512E−05 |
| S9 | −5.0980E−02 | 1.2144E−03 | 6.3664E−03 | −1.1495E−02 | 7.8576E−03 | −2.8662E−03 | 5.8278E−04 | −5.9763E−05 | 2.2846E−06 |
| S10 | 1.4472E−02 | −1.7712E−02 | 1.7262E−02 | −1.1178E−02 | 4.5508E−03 | −1.0917E−03 | 1.5063E−04 | −1.1134E−05 | 3.4342E−07 |
| S11 | −3.5276E−02 | 1.2301E−02 | −2.1766E−03 | 7.0566E−04 | −1.9726E−04 | 3.0813E−05 | −2.6596E−06 | 1.2075E−07 | −2.2688E−09 |
| S12 | 1.3558E−02 | −1.4511E−02 | 6.2181E−03 | −1.7193E−03 | 3.0518E−04 | −3.4560E−05 | 2.3975E−06 | −9.1918E−08 | 1.4796E−09 |

Figure 4A:
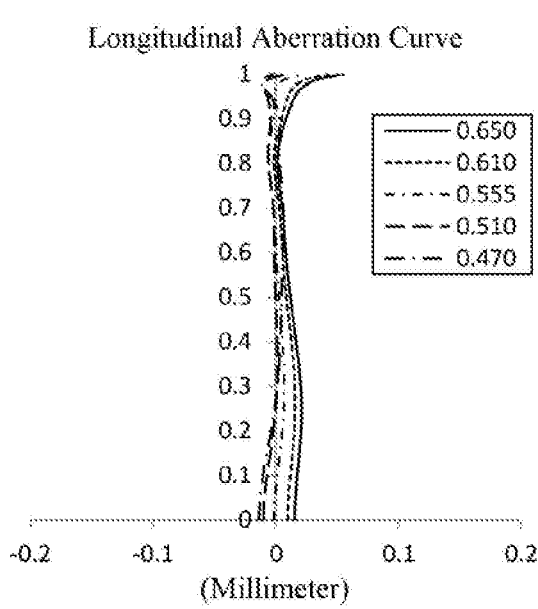
FIGS. 4A to 4D illustrate a longitudinal aberration curve, an astigmatic curve, a distortion curve, and a lateral color curve of the optical imaging lens group of the Example 2, respectively.
Figure 4B:
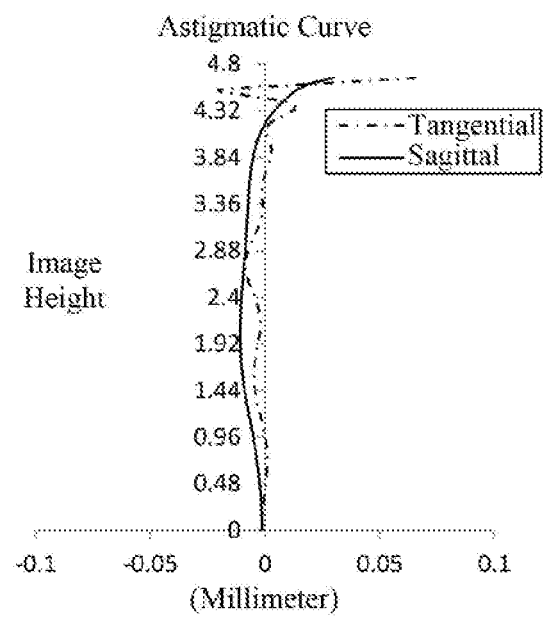
Figure 4C:
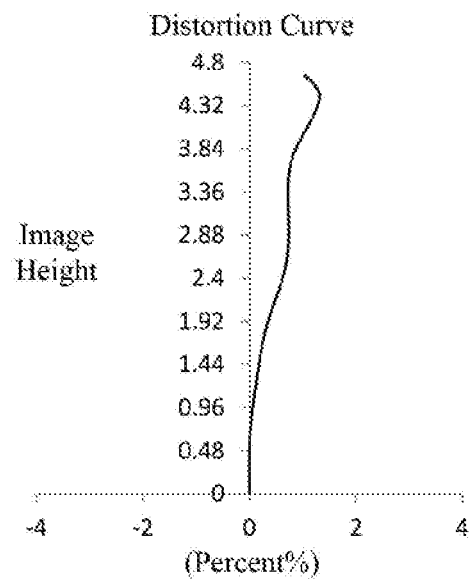
Figure 4D:
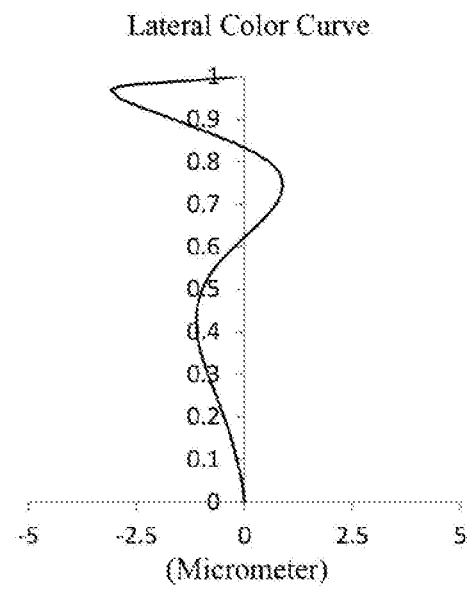

FIG. 4A illustrates a longitudinal aberration curve of the optical imaging lens group according to example 2, representing deviations of focal points converged by light of different wavelengths after passing through the lens assembly. FIG. 4B illustrates an astigmatic curve of the optical imaging lens group according to example 2, representing a curvature of a tangential plane and a curvature of a sagittal plane. FIG. 4C illustrates a distortion curve of the optical imaging lens group according to example 2, representing amounts of distortion corresponding to different image heights. FIG. 4D illustrates a lateral color curve of the optical imaging lens group according to example 2, representing deviations of different image heights on an imaging plane after light passes through the lens assembly. It can be seen from FIG. 4A to FIG. 4D that the optical imaging lens group provided in example 2 may achieve good image quality.

EXAMPLE 3

An optical imaging lens group according to example 3 of the present disclosure is described below with reference to FIG. 5 to FIG. 6D. FIG. 5 shows a schematic structural view of the optical imaging lens group according to example 3 of the present disclosure.

As shown in FIG. 5, the optical imaging lens group includes a stop STO, a first lens E1, a second lens E2, a third lens E3, a fourth lens E4, a fifth lens E5, a sixth lens E6, an optical filter E7 and an imaging plane S15, which are sequentially arranged from an object side to an image side.

The first lens E1 has positive refractive power, an object-side surface S1 thereof is a convex surface, and an image-side surface S2 thereof is a concave surface. The second lens E2 has negative refractive power, an object-side surface S3 thereof is a convex surface, and an image-side surface S4 thereof is a concave surface. The third lens E3 has positive refractive power, an object-side surface S5 thereof is a convex surface, and an image-side surface S6 thereof is a concave surface. The fourth lens E4 has negative refractive power, an object-side surface S7 thereof is a convex surface, and an image-side surface S8 thereof is a concave surface. The fifth lens E5 has positive refractive power, an object-side surface S9 thereof is a convex surface, and an image-side surface S10 thereof is a convex surface. The sixth lens E6 has negative refractive power, an object-side surface S11 thereof is a concave surface, and an image-side surface S12 thereof is a convex surface. The optical filter E7 has an object-side surface S13 and an image-side surface S14. Light from an object sequentially passes through the respective surfaces S1 to S14 and is finally imaged on the imaging plane S15.

In this example, a total effective focal length f of the optical imaging lens group is 5.53 mm, a total length TTL of the optical imaging lens group is 6.21 mm, half of a diagonal length ImgH of an effective pixel area on the imaging plane S15 of the optical imaging lens group is 4.71 mm, and half of a maximal field-of-view Semi-FOV of the optical imaging lens group is 40.2°.

Table 5 is a table illustrating basic parameters of the optical imaging lens group of example 3, wherein the units for the radius of curvature, the thickness/distance and the focal length are millimeter (mm). Table 6 shows high-order coefficients applicable to each aspheric surface in example 3, wherein the surface shape of each aspheric surface may be defined by the formula (1) given in the above example 1.

TABLE 5

| Surface number | Surface type | Radius of curvature | Thickness/ Distance | Material Refractive index | Abbe number | Focal length | Conic coefficient |
|---|---|---|---|---|---|---|---|
| OBJ | Spherical | Infinite | Infinite | | | | |
| STO | Spherical | Infinite | −0.6228 | | | | |
| S1 | Aspheric | 1.9399 | 0.9142 | 1.55 | 56.1 | 4.34 | −0.0282 |
| S2 | Aspheric | 8.9361 | 0.1053 | | | | −98.6762 |
| S3 | Aspheric | 11.0739 | 0.3000 | 1.67 | 19.2 | −10.17 | 59.9057 |
| S4 | Aspheric | 4.2009 | 0.3780 | | | | 2.7399 |
| S5 | Aspheric | 35.7621 | 0.4010 | 1.55 | 56.1 | 68.39 | 98.9974 |
| S6 | Aspheric | 844.8421 | 0.3214 | | | | −91.4248 |
| S7 | Aspheric | 30.1778 | 0.3700 | 1.67 | 20.4 | −139.95 | −35.7906 |
| S8 | Aspheric | 22.6887 | 0.5241 | | | | 0.0000 |
| S9 | Aspheric | 14.7545 | 0.7931 | 1.55 | 56.1 | 3.69 | −78.4964 |
| S10 | Aspheric | −2.2881 | 0.5008 | | | | −0.7713 |
| S11 | Aspheric | −1.3771 | 0.5010 | 1.54 | 55.9 | −2.69 | −2.9958 |
| S12 | Aspheric | −32.8303 | 0.6149 | | | | 65.2586 |
| S13 | Spherical | Infinite | 0.2100 | 1.52 | 64.2 | | |
| S14 | Spherical | Infinite | 0.2805 | | | | |
| S15 | Spherical | Infinite | | | | | |

TABLE 6

| Surface number | A4 | A6 | A8 | A10 | A12 | A14 | A16 | A18 | A20 |
|---|---|---|---|---|---|---|---|---|---|
| S1 | 1.2951E−03 | −3.5104E−03 | 1.5762E−02 | −3.2460E−02 | 3.9367E−02 | −2.9264E−02 | 1.3011E−02 | −3.1838E−03 | 3.2392E−04 |
| S2 | −2.7128E−02 | 2.2283E−02 | 3.0681E−02 | −1.1328E−01 | 1.6961E−01 | −1.5047E−01 | 7.9641E−02 | −2.3134E−02 | 2.8362E−03 |
| S3 | −7.1588E−02 | 8.5309E−02 | −4.8256E−02 | 1.7057E−02 | −9.4573E−03 | 8.0439E−03 | −2.9767E−03 | −2.0257E−05 | 1.8417E−04 |
| S4 | −3.3126E−02 | 4.4181E−02 | 1.1411E−01 | −5.3561E−01 | 1.2083E+00 | −1.6349E+00 | 1.3222E+00 | −5.8634E−01 | 1.0994E−01 |
| S5 | −6.2952E−02 | −1.0857E−02 | 1.7639E−01 | −7.4212E−01 | 1.6161E+00 | −2.0959E+00 | 1.6146E+00 | −6.8425E−01 | 1.2315E−01 |
| S6 | −8.2356E−02 | 4.8956E−02 | −8.3555E−02 | 9.9145E−02 | −9.0021E−02 | 5.1014E−02 | −1.2638E−02 | −1.6691E−03 | 1.1495E−03 |
| S7 | −1.2158E−01 | 8.1975E−02 | −1.0772E−01 | 1.2084E−01 | −1.0385E−01 | 6.2719E−02 | −2.3882E−02 | 4.9772E−03 | −4.2632E−04 |
| S8 | −1.1733E−01 | 7.6445E−02 | −8.3828E−02 | 7.9799E−02 | −5.5318E−02 | 2.6483E−02 | −8.0010E−03 | 1.3484E−03 | −9.5996E−05 |
| S9 | −5.2090E−02 | 7.9491E−04 | 4.9153E−03 | −8.4682E−03 | 5.4755E−03 | −1.8918E−03 | 3.6774E−04 | −3.5534E−05 | 1.1902E−06 |
| S10 | 3.4464E−03 | −1.1622E−02 | 1.2754E−02 | −7.7750E−03 | 2.9073E−03 | −6.2919E−04 | 7.6359E−05 | −4.7928E−06 | 1.1935E−07 |
| S11 | −4.6860E−02 | 2.2030E−02 | −5.5076E−03 | 1.2701E−03 | −2.4012E−04 | 3.0442E−05 | −2.3500E−06 | 9.9999E−08 | −1.8053E−09 |
| S12 | 8.5244E−03 | −8.8352E−03 | 3.4441E−03 | −8.9684E−04 | 1.4970E−04 | −1.5818E−05 | 1.0145E−06 | −3.5485E−08 | 5.1086E−10 |

FIG. 6A illustrates a longitudinal aberration curve of the optical imaging lens group according to example 3, representing deviations of focal points converged by light of different wavelengths after passing through the lens assembly. FIG. 6B illustrates an astigmatic curve of the optical imaging lens group according to example 3, representing a curvature of a tangential plane and a curvature of a sagittal plane. FIG. 6C illustrates a distortion curve of the optical imaging lens group according to example 3, representing amounts of distortion corresponding to different image heights. FIG. 6D illustrates a lateral color curve of the optical imaging lens group according to example 3, representing deviations of different image heights on an imaging plane after light passes through the lens assembly. It can be seen from FIG. 6A to FIG. 6D that the optical imaging lens group provided in example 3 may achieve good image quality.

EXAMPLE 4

An optical imaging lens group according to example 4 of the present disclosure is described below with reference to FIG. 7 to FIG. 8D. FIG. 7 shows a schematic structural view of the optical imaging lens group according to example 4 of the present disclosure.

As shown in FIG. 7, the optical imaging lens group includes a stop STO, a first lens E1, a second lens E2, a third lens E3, a fourth lens E4, a fifth lens E5, a sixth lens E6, an optical filter E7 and an imaging plane S15, which are sequentially arranged from an object side to an image side.

The first lens E1 has positive refractive power, an object-side surface S1 thereof is a convex surface, and an image-side surface S2 thereof is a concave surface. The second lens E2 has negative refractive power, an object-side surface S3 thereof is a convex surface, and an image-side surface S4 thereof is a concave surface. The third lens E3 has positive refractive power, an object-side surface S5 thereof is a convex surface, and an image-side surface S6 thereof is a concave surface. The fourth lens E4 has positive refractive power, an object-side surface S7 thereof is a convex surface, and an image-side surface S8 thereof is a concave surface. The fifth lens E5 has positive refractive power, an object-side surface S9 thereof is a convex surface, and an image-side surface S10 thereof is a convex surface. The sixth lens E6 has negative refractive power, an object-side surface S11 thereof is a concave surface, and an image-side surface S12 thereof is a convex surface. The optical filter E7 has an object-side surface S13 and an image-side surface S14. Light from an object sequentially passes through the respective surfaces S1 to S14 and is finally imaged on the imaging plane S15.

In this example, a total effective focal length f of the optical imaging lens group is 5.53 mm, a total length TTL of the optical imaging lens group is 6.22 mm, half of a diagonal length ImgH of an effective pixel area on the imaging plane S15 of the optical imaging lens group is 4.71 mm, and half of a maximal field-of-view Semi-FOV of the optical imaging lens group is 40.2°.

Table 7 is a table illustrating basic parameters of the optical imaging lens group of example 4, wherein the units for the radius of curvature, the thickness/distance and the focal length are millimeter (mm). Table 8 shows high-order coefficients applicable to each aspheric surface in example 4, wherein the surface shape of each aspheric surface may be defined by the formula (1) given in the above example 1.

EXAMPLE 5

Figure 9:
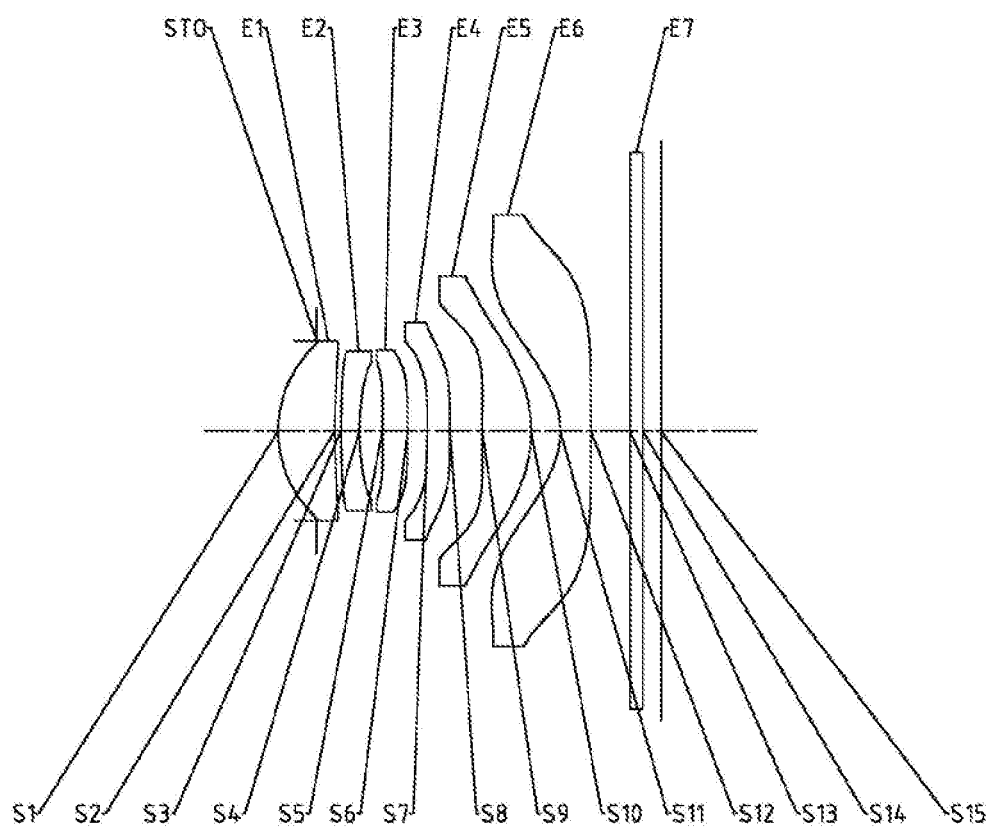
FIG. 9 illustrates a schematic structural view of an optical imaging lens group according to Example 5 of the present disclosure.

An optical imaging lens group according to example 5 of the present disclosure is described below with reference to FIG. 9 to FIG. 10D. FIG. 9 shows a schematic structural view of the optical imaging lens group according to example 5 of the present disclosure.

As shown in FIG. 9, the optical imaging lens group includes a stop STO, a first lens E1, a second lens E2, a third lens E3, a fourth lens E4, a fifth lens E5, a sixth lens E6, an optical filter E7 and an imaging plane S15, which are sequentially arranged from an object side to an image side.

The first lens E1 has positive refractive power, an object-side surface S1 thereof is a convex surface, and an image-side surface S2 thereof is a concave surface. The second lens E2 has negative refractive power, an object-side surface S3 thereof is a convex surface, and an image-side surface S4 thereof is a concave surface. The third lens E3 has positive refractive power, an object-side surface S5 thereof is a convex surface, and an image-side surface S6 thereof is a convex surface. The fourth lens E4 has negative refractive power, an object-side surface S7 thereof is a concave surface, and an image-side surface S8 thereof is a concave surface. The fifth lens E5 has positive refractive power, an object-side surface S9 thereof is a convex surface, and an image-side surface S10 thereof is a convex surface. The sixth lens E6 has negative refractive power, an object-side surface S11 thereof is a concave surface, and an image-side

TABLE 7

| Surface number | Surface type | Radius of curvature | Thickness/ Distance | Material Refractive index | Material Abbe number | Focal length | Conic coefficient |
|---|---|---|---|---|---|---|---|
| OBJ | Spherical | Infinite | Infinite | | | | |
| STO | Spherical | Infinite | −0.6290 | | | | |
| S1 | Aspheric | 1.9315 | 0.9168 | 1.55 | 56.1 | 4.34 | 0.0710 |
| S2 | Aspheric | 8.6639 | 0.1038 | | | | −95.5052 |
| S3 | Aspheric | 10.9462 | 0.3000 | 1.67 | 19.2 | −10.63 | 61.0867 |
| S4 | Aspheric | 4.2953 | 0.3810 | | | | 3.6396 |
| S5 | Aspheric | 61.5627 | 0.4054 | 1.55 | 56.1 | 125.74 | 99.0000 |
| S6 | Aspheric | 595.0604 | 0.2844 | | | | 99.0000 |
| S7 | Aspheric | 30.1016 | 0.3700 | 1.67 | 20.4 | 489.25 | 88.3051 |
| S8 | Aspheric | 33.0002 | 0.5450 | | | | 0.0000 |
| S9 | Aspheric | 25.0770 | 0.7972 | 1.55 | 56.1 | 3.60 | 14.2917 |
| S10 | Aspheric | −2.1097 | 0.4798 | | | | −0.8446 |
| S11 | Aspheric | −1.3652 | 0.5014 | 1.54 | 55.9 | −2.60 | −3.0421 |
| S12 | Aspheric | −72.3997 | 0.6277 | | | | 99.0000 |
| S13 | Spherical | Infinite | 0.2100 | 1.52 | 64.2 | | |
| S14 | Spherical | Infinite | 0.2928 | | | | |
| S15 | Spherical | Infinite | | | | | |

TABLE 8

| Surface number | A4 | A6 | A8 | A10 | A12 | A14 | A16 | A18 | A20 |
|---|---|---|---|---|---|---|---|---|---|
| S1 | 2.1738E−04 | −7.8132E−03 | 2.8667E−02 | −5.7231E−02 | 6.7310E−02 | −4.8278E−02 | 2.0587E−02 | −4.7944E−03 | 4.6252E−04 |
| S2 | −2.3712E−02 | 1.1370E−02 | 5.6272E−02 | −1.4670E−01 | 1.8861E−01 | −1.4607E−01 | 6.7731E−02 | −1.7277E−02 | 1.8628E−03 |
| S3 | −6.9896E−02 | 9.0321E−02 | −8.9621E−02 | 1.4192E−01 | −2.1798E−01 | 2.1664E−01 | −1.2742E−01 | 4.0765E−02 | −5.4740E−03 |
| S4 | −2.8810E−02 | 1.7645E−02 | 2.3712E−01 | −9.0359E−01 | 1.9147E+00 | −2.4881E+00 | 1.9439E+00 | −8.3460E−01 | 1.5142E−01 |
| S5 | −6.0468E−02 | −1.6896E−02 | 2.0323E−01 | −7.9079E−01 | 1.6500E+00 | −2.0769E+00 | 1.5656E+00 | −6.5312E−01 | 1.1614E−01 |
| S6 | −8.4837E−02 | 4.8704E−02 | −6.4423E−02 | 3.8970E−02 | 1.2505E−02 | −5.3853E−02 | 5.0226E−02 | −2.2023E−02 | 3.8933E−03 |
| S7 | −1.1816E−01 | 7.7194E−02 | −1.1611E−01 | 1.5239E−01 | −1.4952E−01 | 9.9713E−02 | −4.2024E−02 | 1.0006E−02 | −1.0224E−03 |
| S8 | −1.0343E−01 | 6.1703E−02 | −7.0554E−02 | 6.7818E−02 | −4.5081E−02 | 1.9994E−02 | −5.5341E−03 | 8.6344E−04 | −5.8354E−05 |
| S9 | −4.4185E−02 | −1.8027E−03 | 7.0775E−03 | −1.1458E−02 | 7.7018E−03 | −2.8084E−03 | 5.7849E−04 | −6.0933E−05 | 2.4435E−06 |
| S10 | 2.1266E−02 | −2.0983E−02 | 1.8495E−02 | −1.1988E−02 | 4.9741E−03 | −1.2136E−03 | 1.6974E−04 | −1.2683E−05 | 3.9434E−07 |
| S11 | −2.8075E−02 | 3.7338E−03 | 1.8072E−03 | −3.2317E−04 | −3.2760E−05 | 1.4039E−05 | −1.5921E−06 | 8.1948E−08 | −1.6514E−09 |
| S12 | 1.0649E−02 | −1.4158E−02 | 6.2346E−03 | −1.7205E−03 | 3.0259E−04 | −3.3977E−05 | 2.3445E−06 | −8.9706E−08 | 1.4449E−09 |

Figure 8A:
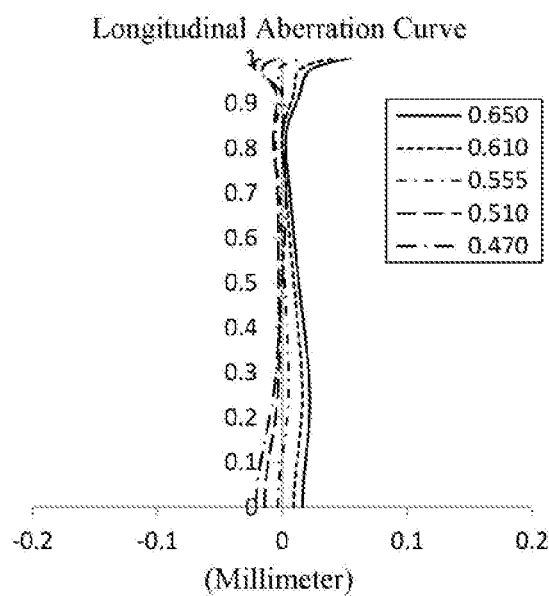
FIGS. 8A to 8D illustrate a longitudinal aberration curve, an astigmatic curve, a distortion curve, and a lateral color curve of the optical imaging lens group of the Example 4, respectively.
Figure 8B:
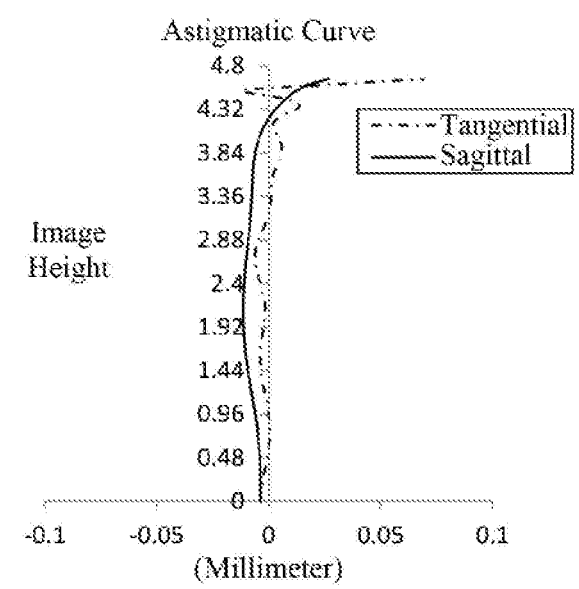
Figure 8C:
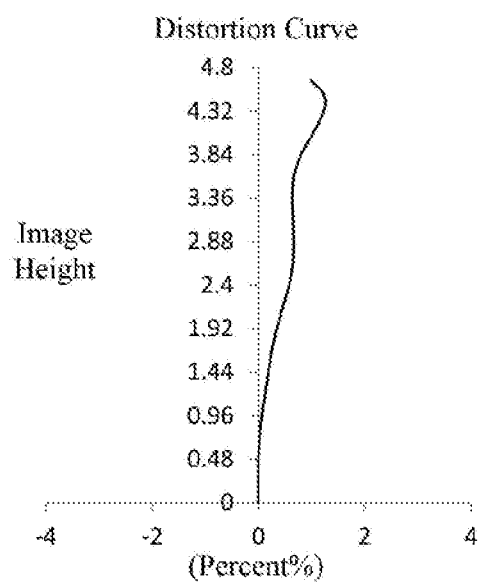
Figure 8D:
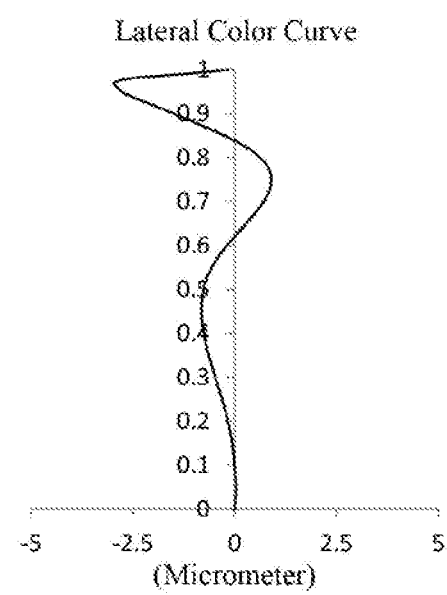

FIG. 8A illustrates a longitudinal aberration curve of the optical imaging lens group according to example 4, representing deviations of focal points converged by light of different wavelengths after passing through the lens assembly. FIG. 8B illustrates an astigmatic curve of the optical imaging lens group according to example 4, representing a curvature of a tangential plane and a curvature of a sagittal plane. FIG. 8C illustrates a distortion curve of the optical imaging lens group according to example 4, representing amounts of distortion corresponding to different image heights. FIG. 8D illustrates a lateral color curve of the optical imaging lens group according to example 4, representing deviations of different image heights on an imaging plane after light passes through the lens assembly. It can be seen from FIG. 8A to FIG. 8D that the optical imaging lens group provided in example 4 may achieve good image quality.

surface S12 thereof is a convex surface. The optical filter E7 has an object-side surface S13 and an image-side surface S14. Light from an object sequentially passes through the respective surfaces S1 to S14 and is finally imaged on the imaging plane S15.

In this example, a total effective focal length f of the optical imaging lens group is 5.53 mm, a total length TTL of the optical imaging lens group is 6.22 mm, half of a diagonal length ImgH of an effective pixel area on the imaging plane S15 of the optical imaging lens group is 4.71 mm, and half of a maximal field-of-view Semi-FOV of the optical imaging lens group is 40.2°.

Table 9 is a table illustrating basic parameters of the optical imaging lens group of example 5, wherein the units for the radius of curvature, the thickness/distance and the focal length are millimeter (mm). Table 10 shows high-order coefficients applicable to each aspheric surface in example 5, wherein the surface shape of each aspheric surface may be defined by the formula (1) Oven in the above example 1.

amounts of distortion corresponding to different image heights. FIG. 10D illustrates a lateral color curve of the optical imaging lens group according to example 5, representing deviations of different image heights on an imaging plane after light passes through the lens assembly. It can be seen from FIG. 10A to FIG. 10D that the optical imaging lens group provided in example 5 may achieve good image quality.

EXAMPLE 6

Figure 11:
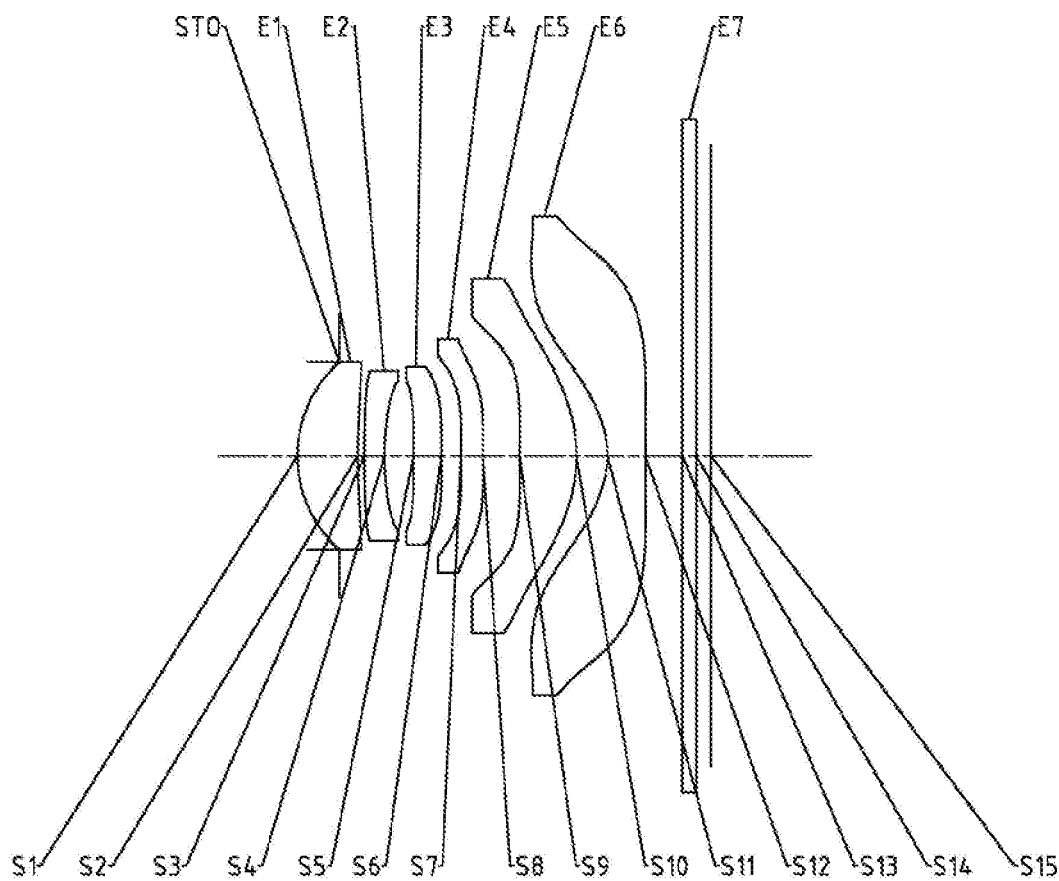
FIG. 11 illustrates a schematic structural view of an optical imaging lens group according to Example 6 of the present disclosure.

An optical imaging lens group according to example 6 of the present disclosure is described below with reference to FIG. 11 to FIG. 12D. FIG. 11 shows a schematic structural view of the optical imaging lens group according to example 6 of the present disclosure.

As shown in FIG. 11, the optical imaging lens group includes a stop STO, a first lens E1, a second lens E2, a third lens E3, a fourth lens E4, a fifth lens E5, a sixth lens E6, an

TABLE 9

| Surface number | Surface type | Radius of curvature | Thickness/ Distance | Material Refractive index | Abbe number | Focal length | Conic coefficient |
|---|---|---|---|---|---|---|---|
| OBJ | Spherical | Infinite | Infinite | | | | |
| STO | Spherical | Infinite | −0.6283 | | | | |
| S1 | Aspheric | 1.9349 | 0.9175 | 1.55 | 56.1 | 4.34 | 0.0789 |
| S2 | Aspheric | 8.8064 | 0.1035 | | | | −96.8411 |
| S3 | Aspheric | 11.2023 | 0.3000 | 1.67 | 19.2 | −10.24 | 60.1234 |
| S4 | Aspheric | 4.2379 | 0.3720 | | | | 2.7237 |
| S5 | Aspheric | 29.6129 | 0.4062 | 1.55 | 56.1 | 53.59 | −28.1724 |
| S6 | Aspheric | −2411.5654 | 0.3216 | | | | −99.0000 |
| S7 | Aspheric | −844.5684 | 0.3700 | 1.67 | 20.4 | −96.47 | −99.0000 |
| S8 | Aspheric | 69.5992 | 0.5194 | | | | 0.0000 |
| S9 | Aspheric | 14.3111 | 0.7969 | 1.55 | 56.1 | 3.55 | −75.7666 |
| S10 | Aspheric | −2.1975 | 0.4704 | | | | −0.8032 |
| S11 | Aspheric | −1.3500 | 0.4992 | 1.54 | 55.9 | −2.60 | −3.0447 |
| S12 | Aspheric | −46.9527 | 0.6312 | | | | 98.0000 |
| S13 | Spherical | Infinite | 0.2100 | 1.52 | 64.2 | | |
| S14 | Spherical | Infinite | 0.2968 | | | | |
| S15 | Spherical | Infinite | | | | | |

TABLE 10

| Surface number | A4 | A6 | A8 | A10 | A12 | A14 | A16 | A18 | A20 |
|---|---|---|---|---|---|---|---|---|---|
| S1 | −6.6847E−05 | −6.7733E−03 | 2.5174E−02 | −5.0044E−02 | 5.8073E−02 | −4.0869E−02 | 1.7003E−02 | −3.8381E−03 | 3.5442E−04 |
| S2 | −2.6749E−02 | 1.7583E−02 | 5.0200E−02 | −1.4247E−01 | 1.8617E−01 | −1.4448E−01 | 6.6657E−02 | −1.6817E−02 | 1.7805E−03 |
| S3 | −7.4267E−02 | 9.3361E−02 | −6.7006E−02 | 6.8385E−02 | −1.0288E−01 | 1.1076E−01 | −6.9465E−02 | 2.3313E−02 | −3.2449E−03 |
| S4 | −3.3908E−02 | 2.9874E−02 | 2.1081E−01 | −8.5797E−01 | 1.8736E+00 | −2.4905E+00 | 1.9829E+00 | −8.6506E−01 | 1.5918E−01 |
| S5 | −6.3461E−02 | −1.5614E−02 | 1.9107E−01 | −7.5238E−01 | 1.5827E+00 | −2.0089E+00 | 1.5283E+00 | −6.4412E−01 | 1.1600E−01 |
| S6 | −8.1341E−02 | 4.5930E−02 | −7.5900E−02 | 7.5137E−02 | −4.6638E−02 | 5.2489E−03 | 1.4885E−02 | −1.0356E−02 | 2.2754E−03 |
| S7 | −1.2318E−01 | 9.8355E−02 | −1.6876E−01 | 2.3856E−01 | −2.4390E−01 | 1.6692E−01 | −7.1487E−02 | 1.7279E−02 | −1.8008E−03 |
| S8 | −1.1763E−01 | 8.3308E−02 | −9.9563E−02 | 9.6737E−02 | −6.5152E−02 | 2.9330E−02 | −8.2300E−03 | 1.2938E−03 | −8.7255E−05 |
| S9 | −4.8204E−02 | 1.6355E−03 | 4.7023E−03 | −8.6459E−03 | 5.2070E−03 | −1.5284E−03 | 2.0879E−04 | −5.7128E−06 | −8.4875E−07 |
| S10 | 1.8105E−02 | −1.9108E−02 | 1.8349E−02 | −1.1730E−02 | 4.6834E−03 | −1.1102E−03 | 1.5272E−04 | −1.1341E−05 | 3.5362E−07 |
| S11 | −3.2924E−02 | 9.0991E−03 | −2.8884E−04 | 1.1643E−04 | −8.8681E−05 | 1.8501E−05 | −1.8111E−06 | 8.8030E−08 | −1.7254E−09 |
| S12 | 1.3434E−02 | −1.5067E−02 | 6.5366E−03 | −1.8045E−03 | 3.1883E−04 | −3.5952E−05 | 2.4859E−06 | −9.5111E−08 | 1.5296E−09 |

Figures 10A, 10B:
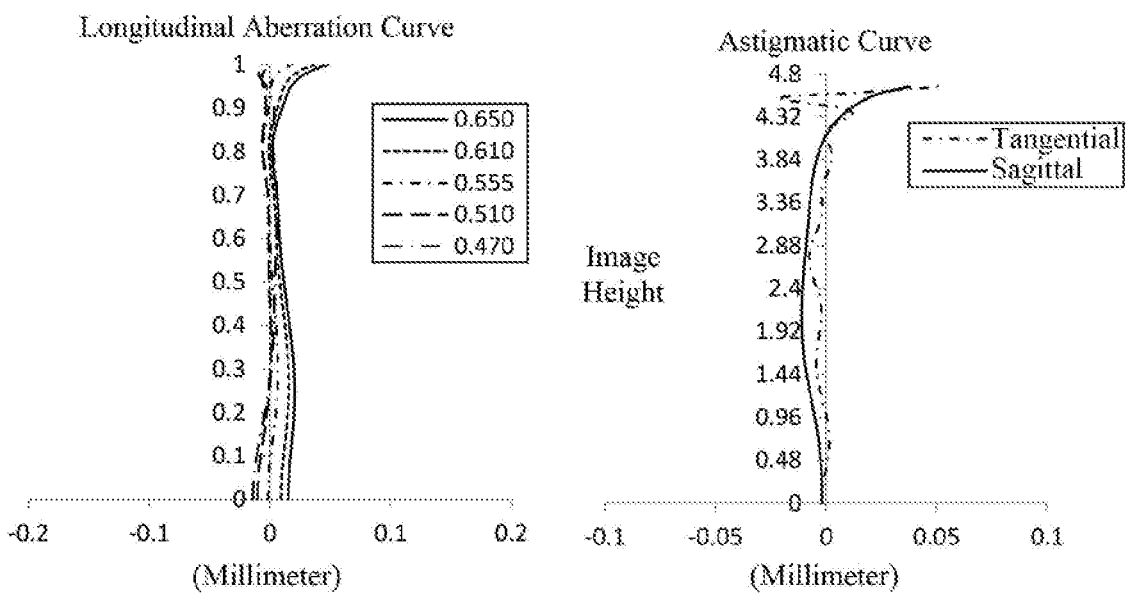
FIGS. 10A to 10D illustrate a longitudinal aberration curve, an astigmatic curve, a distortion curve, and a lateral color curve of the optical imaging lens group of the Example 5, respectively.
Figures 10C, 10D:
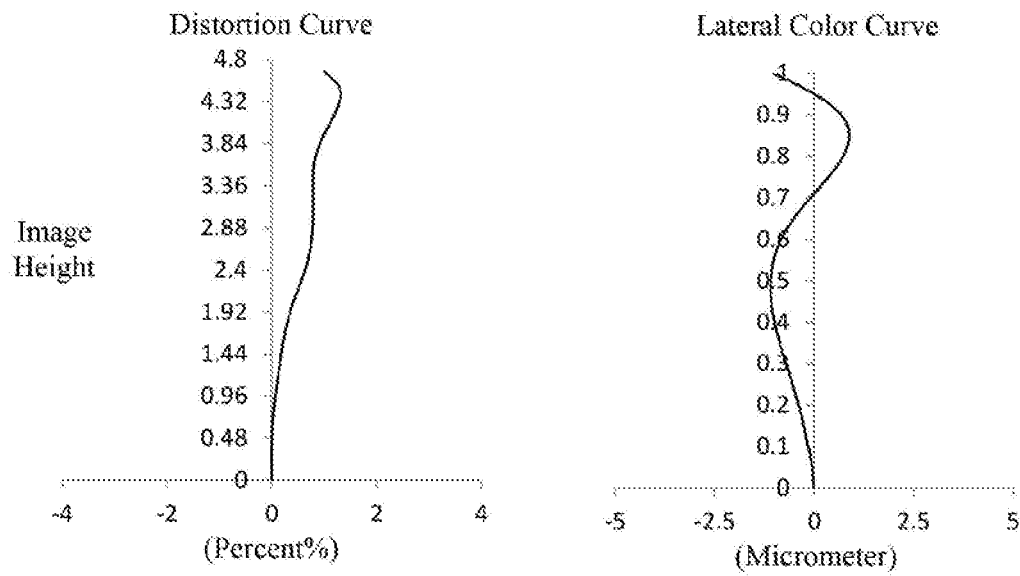

FIG. 10A illustrates a longitudinal aberration curve of the optical imaging lens group according to example 5, representing deviations of focal points converged by light of different wavelengths after passing through the lens assembly. FIG. 10B illustrates an astigmatic curve of the optical imaging lens group according to example 5, representing a curvature of a tangential plane and a curvature of a sagittal plane. FIG. 10C illustrates a distortion curve of the optical imaging lens group according to example 5, representing optical filter E7 and an imaging plane S15, which are sequentially arranged from an object side to an image side.

The first lens E1 has positive refractive power, an object-side surface S1 thereof is a convex surface, and an image-side surface S2 thereof is a concave surface. The second lens E2 has negative refractive power, an object-side surface S3 thereof is a convex surface, and an image-side surface S4 thereof is a concave surface. The third lens E3 has negative refractive power, an object-side surface S5 thereof is a convex surface, and an image-side surface S6 thereof is a concave surface. The fourth lens E4 has positive refractive power, an object-side surface S7 thereof is a convex surface, and an image-side surface S8 thereof is a concave surface. The fifth lens E5 has positive refractive power, an object-side surface S9 thereof is a convex surface, and an image-side surface S10 thereof is a convex surface. The sixth lens E6 has negative refractive power, an object-side surface S11 thereof is a concave surface, and an image-side surface S12 thereof is a convex surface. The optical filter E7 has an object-side surface S13 and an image-side surface S14. Light from an object sequentially passes through the respective surfaces S1 to S14 and is finally imaged on the imaging plane S15.

In this example, a total effective focal length f of the optical imaging lens group is 5.50 mm, a total length TTL of the optical imaging lens group is 6.25 mm, half of a diagonal length ImgH of an effective pixel area on the imaging plane S15 of the optical imaging lens group is 4.71 mm, and half of a maximal field-of-view Semi-FOV of the optical imaging lens group is 40.2°.

Table 11 is a table illustrating basic parameters of the optical imaging lens group of example 6, wherein the units for the radius of curvature, the thickness/distance and the focal length are millimeter (mm). Table 12 shows high-order coefficients applicable to each aspheric surface in example 6, wherein the surface shape of each aspheric surface may be defined by the formula (1) given in the above example 1.

TABLE 11

| Surface number | Surface type | Radius of curvature | Thickness/Distance | Material Refractive index | Abbe number | Focal length | Conic coefficient |
|---|---|---|---|---|---|---|---|
| OBJ | Spherical | Infinite | Infinite | | | | |
| STO | Spherical | Infinite | −0.6296 | | | | |
| S1 | Aspheric | 1.9349 | 0.9110 | 1.55 | 56.1 | 4.34 | 0.0902 |
| S2 | Aspheric | 8.8072 | 0.1010 | | | | −97.9622 |
| S3 | Aspheric | 11.2869 | 0.3054 | 1.67 | 19.2 | −11.12 | 58.6694 |
| S4 | Aspheric | 4.4692 | 0.4370 | | | | 3.8422 |
| S5 | Aspheric | 171.8159 | 0.4193 | 1.55 | 56.1 | −2499.81 | 98.0000 |
| S6 | Aspheric | 152.4722 | 0.2955 | | | | −99.0000 |
| S7 | Aspheric | 20.5835 | 0.3363 | 1.67 | 20.4 | 60.57 | 77.3246 |
| S8 | Aspheric | 41.7281 | 0.5516 | | | | 0.0000 |
| S9 | Aspheric | 21.8723 | 0.8583 | 1.55 | 56.1 | 4.14 | −10.3725 |
| S10 | Aspheric | −2.4872 | 0.4676 | | | | −0.7382 |
| S11 | Aspheric | −1.4842 | 0.5740 | 1.54 | 55.9 | −2.89 | −2.9012 |
| S12 | Aspheric | −37.8053 | 0.5590 | | | | 98.0000 |
| S13 | Spherical | Infinite | 0.2100 | 1.52 | 64.2 | | |
| S14 | Spherical | Infinite | 0.2247 | | | | |
| S15 | Spherical | Infinite | | | | | |

TABLE 12

| Surface number | A4 | A6 | A8 | A10 | A12 | A14 | A16 | A18 | A20 |
|---|---|---|---|---|---|---|---|---|---|
| S1 | 3.4324E−03 | −2.3632E−02 | 7.5846E−02 | −1.4205E−01 | 1.6345E−01 | −1.1703E−01 | 5.0648E−02 | −1.2123E−02 | 1.2242E−03 |
| S2 | −2.3058E−02 | 1.7295E−02 | 1.4533E−02 | −3.8521E−02 | 3.0601E−02 | −7.7251E−03 | −4.0020E−03 | 2.9950E−03 | −5.3386E−04 |
| S3 | −6.3052E−02 | 5.6606E−02 | 1.9020E−02 | −1.0586E−01 | 1.4132E−01 | −1.0779E−01 | 5.0088E−02 | −1.3195E−02 | 1.5549E−03 |
| S4 | −2.3497E−02 | 2.8536E−03 | 2.8689E−01 | −1.0528E+00 | 2.1928E+00 | −2.7986E+00 | 2.1519E+00 | −9.1284E−01 | 1.6448E−01 |
| S5 | −6.2307E−02 | 2.6535E−02 | −7.0120E−02 | 9.4107E−02 | −5.9227E−02 | −3.7564E−02 | 9.9343E−02 | −7.1137E−02 | 1.8338E−02 |
| S6 | −8.2998E−02 | 3.9784E−02 | −2.1394E−02 | −9.9916E−02 | 2.4739E−01 | −2.7322E−01 | 1.6693E−01 | −5.5002E−02 | 7.6704E−03 |
| S7 | −1.1762E−01 | 6.6852E−02 | −4.9789E−02 | −1.6194E−02 | 5.9125E−02 | −4.8014E−02 | 2.1370E−02 | −5.5437E−03 | 6.4691E−04 |
| S8 | −1.0882E−01 | 6.7407E−02 | −5.6067E−02 | 2.9027E−02 | −1.1954E−02 | 6.6084E−03 | −2.8383E−03 | 6.1821E−04 | −5.1404E−05 |
| S9 | −5.7946E−02 | 7.3038E−03 | 1.9548E−02 | −2.4909E−02 | 1.2449E−02 | −3.3591E−03 | 5.1536E−04 | −4.1198E−05 | 1.2631E−06 |
| S10 | −5.9862E−03 | −1.0475E−02 | 2.8958E−02 | −2.0821E−02 | 7.5356E−03 | −1.5475E−03 | 1.8333E−04 | −1.1719E−05 | 3.1377E−07 |
| S11 | −3.2014E−02 | 9.6725E−03 | −1.2050E−03 | 4.2592E−04 | −1.3660E−04 | 2.2083E−05 | −1.8980E−06 | 8.4529E−08 | −1.5473E−09 |
| S12 | 2.9045E−02 | −2.1104E−02 | 6.5140E−03 | −1.2229E−03 | 1.4312E−04 | −1.0164E−05 | 3.8394E−07 | −4.3498E−09 | −8.4451E−11 |

Figure 12A:
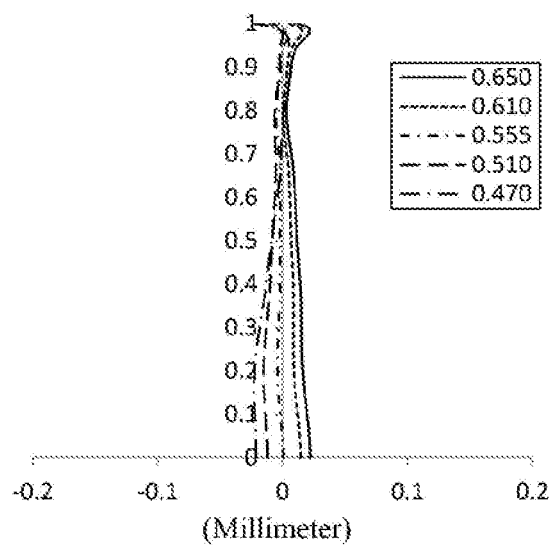
FIGS. 12A to 12D illustrate a longitudinal aberration curve, an astigmatic curve, a distortion curve, and a lateral color curve of the optical imaging lens group of the Example 6, respectively.
Figure 12B:
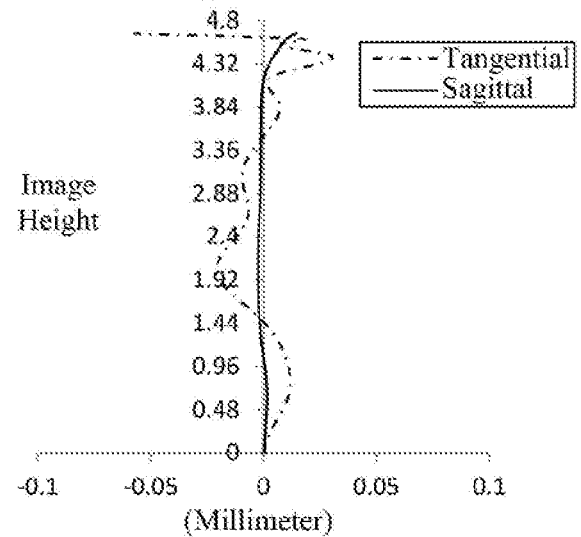
Figure 12C:
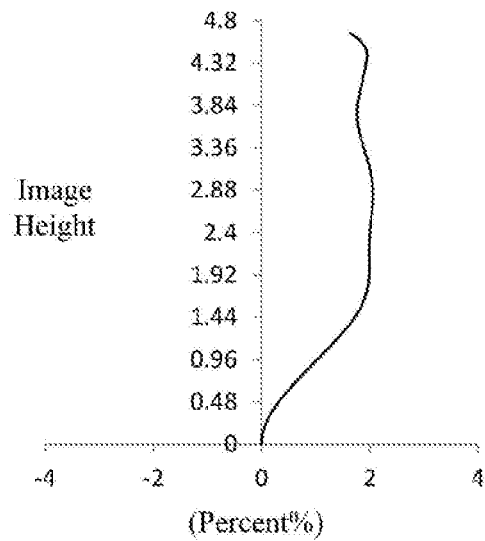
Figure 12D:
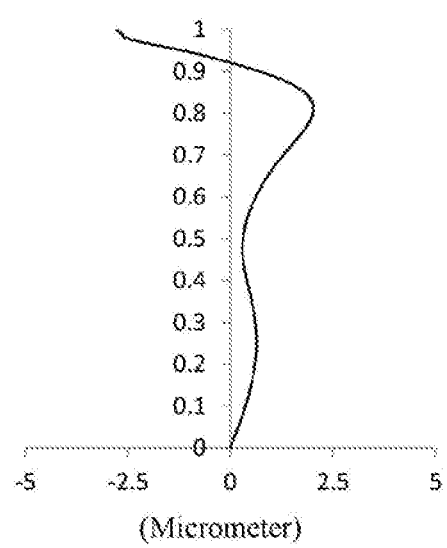

FIG. 12A illustrates a longitudinal aberration curve of the optical imaging lens group according to example 6, representing deviations of focal points converged by light of different wavelengths after passing through the lens assembly. FIG. 12B illustrates an astigmatic curve of the optical imaging lens group according to example 6, representing a curvature of a tangential plane and a curvature of a sagittal plane. FIG. 12C illustrates a distortion curve of the optical imaging lens group according to example 6, representing amounts of distortion corresponding to different image heights. FIG. 12D illustrates a lateral color curve of the optical imaging lens group according to example 6, representing deviations of different image heights on an imaging plane after light passes through the lens assembly. It can be seen from FIG. 12A to FIG. 12D that the optical imaging lens group provided in example 6 may achieve good image quality.

EXAMPLE 7

Figure 13:
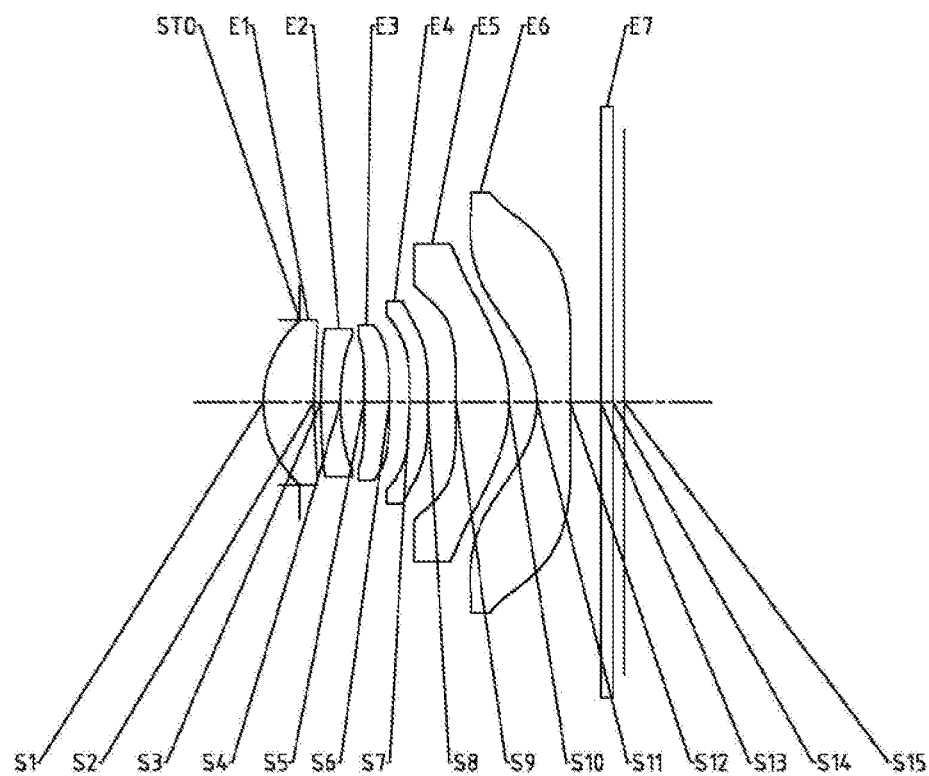
FIG. 13 illustrates a schematic structural view of an optical imaging lens group according to Example 7 of the present disclosure.

An optical imaging lens group according to example 7 of the present disclosure is described below with reference to FIG. 13 to FIG. 14D. FIG. 13 shows a schematic structural view of the optical imaging lens group according to example 7 of the present disclosure.

As shown in FIG. 13, the optical imaging lens group includes a stop STO, a first lens E1, a second lens E2, a third lens E3, a fourth lens E4, a fifth lens E5, a sixth lens E6, an optical filter E7 and an imaging plane S15, which are sequentially arranged from an object side to an image side.

The first lens E1 has positive refractive power, an object-side surface S1 thereof is a convex surface, and an image-side surface S2 thereof is a concave surface. The second lens E2 has negative refractive power, an object-side surface S3 thereof is a convex surface, and an image-side surface S4 thereof is a concave surface. The third lens E3 has positive refractive power, an object-side surface S5 thereof is a convex surface, and an image-side surface S6 thereof is a convex surface. The fourth lens E4 has positive refractive power, an object-side surface S7 thereof is a concave surface, and an image-side surface S8 thereof is a convex surface. The fifth lens E5 has positive refractive power, an object-side surface S9 thereof is a convex surface, and an image-side surface S10 thereof is a convex surface. The sixth lens E6 has negative refractive power, an object-side surface S11 thereof is a concave surface, and an image-side surface S12 thereof is a convex surface. The optical filter E7 has an object-side surface S13 and an image-side surface S14. Light from an object sequentially passes through the respective surfaces S1 to S14 and is finally imaged on the imaging plane S15.

In this example, a total effective focal length f of the optical imaging lens group is 5.50 mm, a total length TTL of the optical imaging lens group is 6.25 mm, half of a diagonal length ImgH of an effective pixel area on the imaging plane S15 of the optical imaging lens group is 4.72 mm, and half of a maximal field-of-view Semi-FOV of the optical imaging lens group is 40.2°.

Table 13 is a table illustrating basic parameters of the optical imaging lens group of example 7, wherein the units for the radius of curvature, the thickness/distance and the focal length are millimeter (mm). Table 14 shows high-order coefficients applicable to each aspheric surface in example 7, wherein the surface shape of each aspheric surface may be defined by the formula (1) given in the above example 1.

TABLE 13

| Surface number | Surface type | Radius of curvature | Thickness/ Distance | Material Refractive index | Abbe number | Focal length | Conic coefficient |
|---|---|---|---|---|---|---|---|
| OBJ | Spherical | Infinite | Infinite | | | | |
| STO | Spherical | Infinite | −0.6292 | | | | |
| S1 | Aspheric | 1.9349 | 0.8765 | 1.55 | 56.1 | 4.34 | 0.0884 |
| S2 | Aspheric | 8.8755 | 0.1246 | | | | −85.7850 |
| S3 | Aspheric | 11.4252 | 0.3364 | 1.67 | 19.2 | −10.44 | 57.8291 |
| S4 | Aspheric | 4.3160 | 0.4070 | | | | 3.4954 |
| S5 | Aspheric | 42.4452 | 0.4367 | 1.55 | 56.1 | 37.55 | 98.0000 |
| S6 | Aspheric | −39.5143 | 0.3485 | | | | −60.1091 |
| S7 | Aspheric | −434.2850 | 0.3187 | 1.67 | 20.4 | 36617586.84 | 98.0000 |
| S8 | Aspheric | −434.4048 | 0.4815 | | | | 0.0000 |
| S9 | Aspheric | 25.0534 | 0.9276 | 1.55 | 56.1 | 4.55 | −84.7263 |
| S10 | Aspheric | −2.7198 | 0.4854 | | | | −0.7232 |
| S11 | Aspheric | −1.5363 | 0.5760 | 1.54 | 55.9 | −3.00 | −2.9054 |
| S12 | Aspheric | −37.9876 | 0.5278 | | | | 98.0000 |
| S13 | Spherical | Infinite | 0.2100 | 1.52 | 64.2 | | |
| S14 | Spherical | Infinite | 0.1935 | | | | |
| S15 | Spherical | Infinite | | | | | |

TABLE 14

| Surface number | A4 | A6 | A8 | A10 | A12 | A14 | A16 | A18 | A20 |
|---|---|---|---|---|---|---|---|---|---|
| S1 | 2.2006E−03 | −1.6737E−02 | 5.2145E−02 | −9.5467E−02 | 1.0778E−01 | −7.5921E−02 | 3.2327E−02 | −7.6006E−03 | 7.4993E−04 |
| S2 | −1.7510E−02 | 8.8482E−03 | 2.6158E−02 | −6.5907E−02 | 7.9310E−02 | −5.7707E−02 | 2.5257E−02 | −6.1395E−03 | 6.4176E−04 |
| S3 | −5.5774E−02 | 4.8508E−02 | 7.6414E−04 | −4.2771E−02 | 5.1615E−02 | −3.2658E−02 | 1.1783E−02 | −2.2035E−03 | 1.7563E−04 |
| S4 | −2.2693E−02 | 2.5153E−03 | 2.5243E−01 | −9.1316E−01 | 1.9016E+00 | −2.4242E+00 | 1.8573E+00 | −7.8315E−01 | 1.3998E−01 |
| S5 | −5.7507E−02 | 6.8139E−03 | 2.5188E−03 | −1.0151E−01 | 2.9344E−01 | −4.4623E−01 | 3.8833E−01 | −1.8285E−01 | 3.6128E−02 |
| S6 | −6.8530E−02 | 4.1032E−03 | 4.9272E−02 | −2.1064E−01 | 3.6566E−01 | −3.5578E−01 | 2.0239E−01 | −6.3093E−02 | 8.3226E−03 |
| S7 | −1.0961E−01 | 5.7799E−02 | −4.5728E−02 | −8.6439E−04 | 2.1096E−02 | −1.1095E−02 | 3.0840E−03 | −8.2394E−04 | 1.2787E−04 |
| S8 | −1.1541E−01 | 7.9248E−02 | −7.4743E−02 | 5.2392E−02 | −3.3566E−02 | 1.8964E−02 | −6.8314E−03 | 1.2821E−03 | −9.5240E−05 |

TABLE 14-continued

| Surface number | A4 | A6 | A8 | A10 | A12 | A14 | A16 | A18 | A20 |
|---|---|---|---|---|---|---|---|---|---|
| S9 | −6.5960E−02 | 2.0766E−02 | 3.3853E−03 | −1.1839E−02 | 5.0687E−03 | −5.6292E−04 | −1.5546E−04 | 4.9513E−05 | −3.9126E−06 |
| S10 | −1.0668E−02 | −1.6825E−03 | 1.8449E−02 | −1.4022E−02 | 5.0113E−03 | −9.9650E−04 | 1.1345E−04 | −6.9452E−06 | 1.7786E−07 |
| S11 | −2.9284E−02 | 7.6053E−03 | −3.1698E−04 | 1.0477E−04 | −5.9000E−05 | 1.0818E−05 | −9.4950E−07 | 4.1619E−08 | −7.3752E−10 |
| S12 | 2.8567E−02 | −2.0246E−02 | 6.1195E−03 | −1.1297E−03 | 1.2986E−04 | −8.9414E−06 | 3.1084E−07 | −1.8840E−09 | −1.1697E−10 |

Figure 14A:
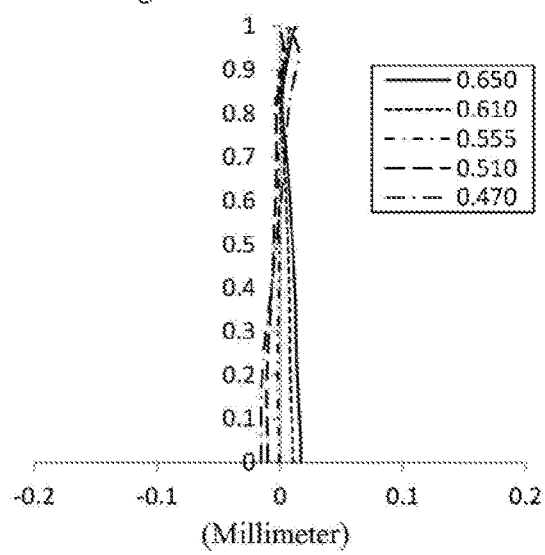
FIGS. 14A to 14D illustrate a longitudinal aberration curve, an astigmatic curve, a distortion curve, and a lateral color curve of the optical imaging lens group of the Example 7, respectively.
Figure 14B:
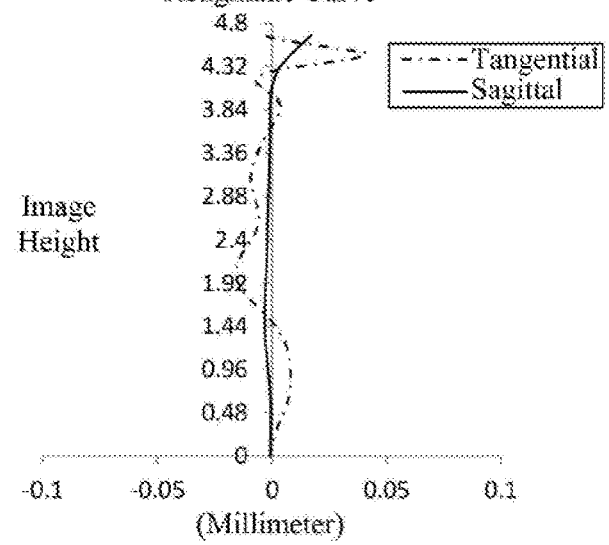
Figure 14C:
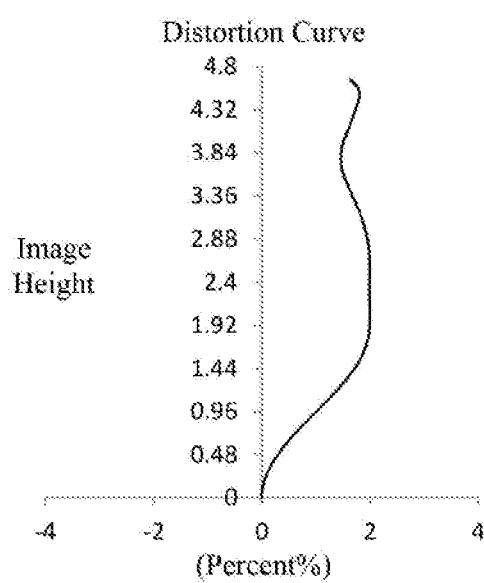
Figure 14D:
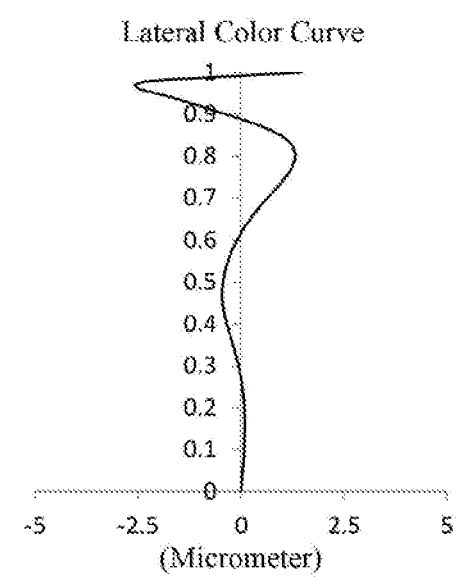

FIG. 14A illustrates a longitudinal aberration curve of the optical imaging lens group according to example 7, representing deviations of focal points converged by light of different wavelengths after passing through the lens assembly. FIG. 14B illustrates an astigmatic curve of the optical imaging lens group according to example 7, representing a curvature of a tangential plane and a curvature of a sagittal plane. FIG. 14C illustrates a distortion curve of the optical imaging lens group according to example 7, representing amounts of distortion corresponding to different image heights. FIG. 14D illustrates a lateral color curve of the optical imaging lens group according to example 7, representing deviations of different image heights on an imaging plane after light passes through the lens assembly. It can be seen from FIG. 14A to FIG. 14D that the optical imaging lens group provided in example 7 may achieve good image quality.

In view of the above, examples 1 to 7 respectively satisfy the relationship shown in Table 15.

TABLE 15

| Condition/Example | 1 | 2 | 3 | 4 | 5 | 6 | 7 |
|---|---|---|---|---|---|---|---|
| f/EPD | 1.89 | 1.89 | 1.89 | 1.89 | 1.89 | 1.92 | 1.92 |
| TTL/ImgH | 1.32 | 1.32 | 1.32 | 1.32 | 1.32 | 1.33 | 1.33 |
| f*tan(Semi-FOV) (mm) | 4.67 | 4.67 | 4.67 | 4.67 | 4.67 | 4.65 | 4.65 |
| f1/f − f6/f | 1.27 | 1.26 | 1.27 | 1.26 | 1.25 | 1.32 | 1.33 |
| f45/f123 | 0.64 | 0.63 | 0.63 | 0.60 | 0.62 | 0.65 | 0.81 |
| DT41/DT52 | 0.59 | 0.59 | 0.60 | 0.59 | 0.58 | 0.56 | 0.55 |
| ET1/ET5 | 0.78 | 0.77 | 0.77 | 0.78 | 0.78 | 0.70 | 0.49 |
| SAG41/SAG51 | 0.52 | 0.53 | 0.51 | 0.50 | 0.53 | 0.48 | 0.56 |
| SAG52/SAG62 | 0.92 | 0.94 | 0.92 | 0.94 | 0.98 | 0.82 | 0.74 |
| f/f2 | −0.55 | −0.54 | −0.54 | −0.52 | −0.54 | −0.49 | −0.53 |
| R2/R3 | 0.80 | 0.79 | 0.81 | 0.79 | 0.79 | 0.78 | 0.78 |
| (R4 − R1)/(R4 + R1) | 0.37 | 0.37 | 0.37 | 0.38 | 0.37 | 0.40 | 0.38 |
| (R9 + R10)/(R9 − R10) | 0.76 | 0.75 | 0.73 | 0.84 | 0.73 | 0.80 | 0.80 |
| R12/(R11 + R12) | 0.96 | 0.97 | 0.96 | 0.98 | 0.97 | 0.96 | 0.96 |
| CT5/CT1 | 0.86 | 0.87 | 0.87 | 0.87 | 0.87 | 0.94 | 1.06 |
| CT2/T23 | 0.81 | 0.81 | 0.79 | 0.79 | 0.81 | 0.70 | 0.83 |
| T34/T45 | 0.62 | 0.60 | 0.61 | 0.52 | 0.62 | 0.54 | 0.72 |

The present disclosure further provides an imaging apparatus, having an electronic photosensitive element which may be a photosensitive Charge-Coupled Device (CCD) or a Complementary Metal-Oxide Semiconductor (CMOS). The imaging apparatus may be an independent imaging device such as a digital camera, or may be an imaging module integrated in a mobile electronic device such as a mobile phone. The imaging apparatus is equipped with the optical imaging lens group described above.

The foregoing is only a description of the preferred examples of the present disclosure and the applied technical principles. It should be appreciated by those skilled in the art that the inventive scope of the present disclosure is not limited to the technical solutions formed by the particular combinations of the above technical features. The inventive scope should also cover other technical solutions formed by any combinations of the above technical features or equivalent features thereof without departing from the concept of the invention, such as, technical solutions formed by replacing the features as disclosed in the present disclosure with (but not limited to), technical features with similar functions.

What is claimed is:

1. An optical imaging lens group, sequentially from an object side to an image side of the optical imaging lens group along an optical axis, comprising:
   a first lens having positive refractive power with a convex object-side surface;
   a second lens having refractive power;
   a third lens having refractive power;
   a fourth lens having refractive power;
   a fifth lens having refractive power; and
   a sixth lens having negative refractive power with a concave object-side surface and a convex image-side surface,
   wherein f/EPD<2, and
   f*tan(Semi-FOV)>4.5 mm,
   where f is a total effective focal length of the optical imaging lens group, EPD is an entrance pupil diameter of the optical imaging lens group, and Semi-FOV is half of a maximal field-of-view of the optical imaging lens group.

2. The optical imaging lens group according to claim 1, wherein
   the second lens has negative refractive power, a convex object-side surface, and a concave image-side surface; and
   the fifth lens has positive refractive power, a convex object-side surface, and a convex image-side surface.

3. The optical imaging lens group according to claim 1, wherein 1<f1/f−f6/f<2,
   where f is the total effective focal length of the optical imaging lens group, f1 is an effective focal length of the first lens, and f6 is an effective focal length of the sixth lens.

4. The optical imaging lens group according to claim 1, wherein 0.3<DT41/DT52<0.8, where DT41 is a maximum effective radius of an object-side surface of the fourth lens, and DT52 is a maximum effective radius of an image-side surface of the fifth lens.

5. The optical imaging lens group according to claim 1, wherein 0.3<ET1/ET5<0.8, where ET1 is an edge thickness of the first lens, and ET5 is an edge thickness of the fifth lens.

6. The optical imaging lens group according to claim 1, wherein 0.3<SAG41/SAG51<0.8, where SAG41 is a distance along the optical axis from an intersection of an object-side surface of the fourth lens and the optical axis to a vertex of an effective radius of the object-side surface of the fourth lens, and SAG51 is a distance along the optical axis from an intersection of an object-side surface of the fifth lens and the optical axis to a vertex of an effective radius of the object-side surface of the fifth lens.

7. The optical imaging lens group according to claim 1, wherein 0.5<SAG52/SAG62<1, where SAG52 is a distance along the optical axis from an intersection of an image-side surface of the fifth lens and the optical axis to a vertex of an effective radius of the image-side surface of the fifth lens, and SAG62 is a distance along the optical axis from an intersection of the image-side surface of the sixth lens and the optical axis to a vertex of an effective radius of the image-side surface of the sixth lens.

8. The optical imaging lens group according to claim 1, wherein −0.8<f/f2<−0.3, where f is the total effective focal length of the optical imaging lens group, and f2 is an effective focal length of the second lens.

9. The optical imaging lens group according to claim 1, wherein 0.7<CT5/CT1<1.2, where CT1 is a center thickness of the first lens along the optical axis, and CT5 is a center thickness of the fifth lens along the optical axis.

10. The optical imaging lens group according to claim 1, wherein 0.5<CT2/T23<1, where CT2 is a center thickness of the second lens along the optical axis, and T23 is a spaced interval between the second lens and the third lens along the optical axis.

11. The optical imaging lens group according to claim 1, wherein 0.4<T34/T45<0.9, where T34 is a spaced interval between the third lens and the fourth lens along the optical axis, and T45 is a spaced interval between the fourth lens and the fifth lens along the optical axis.

12. The optical imaging lens group according to claim 1, wherein 0.5<f45/f123<1, where f123 is a combined focal length of the first lens, the second lens, and the third lens, and f45 is a combined focal length of the fourth lens and the fifth lens.

13. An optical imaging lens group, sequentially from an object side to an image side of the optical imaging lens group along an optical axis, comprising:

a first lens having positive refractive power with a convex object-side surface;
a second lens having refractive power;
a third lens having refractive power;
a fourth lens having refractive power;
a fifth lens having refractive power; and
a sixth lens having negative refractive power with a concave object-side surface and a convex image-side surface,
wherein TTL/ImgH <1.4, and
f*tan(Semi-FOV) >4.5 mm,
where Semi-FOV is half of a maximal field-of-view of the optical imaging lens group, f is a total effective focal length of the optical imaging lens group, TTL is a distance along the optical axis from the object-side surface of the first lens to an imaging plane of the optical imaging lens group, and ImgH is half of a diagonal length of an effective pixel area on the imaging plane of the optical imaging lens group.

14. The optical imaging lens group according to claim 13, wherein 1<f1/f−f6/f<2, where f is the total effective focal length of the optical imaging lens group, f1 is an effective focal length of the first lens, and f6 is an effective focal length of the sixth lens.

15. The optical imaging lens group according to claim 13, wherein −0.8<f/f2<−0.3, where f is the total effective focal length of the optical imaging lens group, and f2 is an effective focal length of the second lens.

16. The optical imaging lens group according to claim 13, wherein 0.5<f45/f123<1, where f123 is a combined focal length of the first lens, the second lens, and the third lens, and f45 is a combined focal length of the fourth lens and the fifth lens.

17. The optical imaging lens group according to claim 13, wherein 0.5<R2/R3<1, where R2 is a radius of curvature of an image-side surface of the first lens, and R3 is a radius of curvature of an object-side surface of the second lens.

18. The optical imaging lens group according to claim 13, wherein 0.3<(R4−R1)/(R4+R1)<0.8, where R1 is a radius of curvature of the object-side surface of the first lens, and R4 is a radius of curvature of an image-side surface of the second lens.

19. The optical imaging lens group according to claim 13, wherein 0.5<(R9+R10)/(R9−R10)<1, where R9 is a radius of curvature of an object-side surface of the fifth lens, and R10 is a radius of curvature of an image-side surface of the fifth lens.

20. The optical imaging lens group according to claim 13, wherein 0.5<R12/(R11+R12)<1, where R11 is a radius of curvature of the object-side surface of the sixth lens, and R12 is a radius of curvature of the image-side surface of the sixth lens.

* * * * *